(12) United States Patent
Nakamura et al.

(10) Patent No.: US 10,534,263 B2
(45) Date of Patent: Jan. 14, 2020

(54) RESIN COMPOSITION AND METHOD OF FORMING RESIST PATTERN

(71) Applicant: TOKYO OHKA KOGYO CO., LTD., Kawasaki-shi (JP)

(72) Inventors: Tsuyoshi Nakamura, Incheon (KR); Kazuishi Tanno, Incheon (KR); JunYeob Lee, Incheon (KR)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/848,404

(22) Filed: Dec. 20, 2017

(65) Prior Publication Data
US 2018/0180997 A1 Jun. 28, 2018

(30) Foreign Application Priority Data
Dec. 22, 2016 (KR) .................. 10-2016-0176873

(51) Int. Cl.
| | | |
|---|---|---|
| G03F 7/004 | (2006.01) | |
| G03F 7/30 | (2006.01) | |
| C08F 220/28 | (2006.01) | |
| C08F 222/10 | (2006.01) | |
| C08F 224/00 | (2006.01) | |
| C08F 232/02 | (2006.01) | |
| C08F 232/08 | (2006.01) | |
| G03F 7/039 | (2006.01) | |
| G03F 7/038 | (2006.01) | |
| G03F 7/16 | (2006.01) | |
| G03F 7/20 | (2006.01) | |
| G03F 7/32 | (2006.01) | |
| C08F 220/16 | (2006.01) | |
| C08F 220/38 | (2006.01) | |
| G03F 7/38 | (2006.01) | |

(52) U.S. Cl.
CPC .......... *G03F 7/0397* (2013.01); *C08F 220/16* (2013.01); *C08F 220/28* (2013.01); *C08F 220/38* (2013.01); *C08F 222/10* (2013.01); *C08F 224/00* (2013.01); *C08F 232/02* (2013.01); *C08F 232/08* (2013.01); *G03F 7/0045* (2013.01); *G03F 7/038* (2013.01); *G03F 7/039* (2013.01); *G03F 7/162* (2013.01); *G03F 7/168* (2013.01); *G03F 7/2006* (2013.01); *G03F 7/30* (2013.01); *G03F 7/327* (2013.01); *G03F 7/38* (2013.01); *C08F 2220/283* (2013.01); *C08F 2220/382* (2013.01)

(58) Field of Classification Search
CPC ........ G03F 7/0045; G03F 7/0397; G03F 7/30; C08F 222/10; C08F 224/00; C08F 232/02; C08F 232/08
USPC ..... 430/270.1, 905, 910, 326; 526/281, 282, 526/308, 309, 321, 325
See application file for complete search history.

(56) References Cited

U.S. PATENT DOCUMENTS 7,569,326 B2 * 8/2009 Ohsawa .................. C08F 20/22
430/270.1
9,714,217 B2 * 7/2017 Hosoi ................... C07C 309/12

FOREIGN PATENT DOCUMENTS

JP 5708500 B 4/2015
JP 5747311 B 7/2015

* cited by examiner

*Primary Examiner* — John S Chu
(74) *Attorney, Agent, or Firm* — Knobbe, Martens, Olson & Bear LLP

(57) ABSTRACT

A resist composition which generates acid upon exposure and exhibits changed solubility in a developing solution by the action of acid, which includes a polymeric compound having at least two specific structural units.

7 Claims, No Drawings

RESIN COMPOSITION AND METHOD OF FORMING RESIST PATTERN

TECHNICAL FIELD

The present invention relates to a resist composition and a method of forming a resist pattern.

Priority is claimed on Korean Patent Application No. 10-2016-0176873, filed Dec. 22, 2016, the content of which is incorporated herein by reference.

BACKGROUND ART

Techniques (pattern-forming techniques) in which a fine pattern is formed on top of a substrate, and a lower layer beneath that pattern is then fabricated by conducting etching with this pattern as a mask are widely used in the production of semiconductor devices and liquid display device. These types of fine patterns are usually formed from an organic material, and are formed using a lithography method or a nanoimprint method or the like. For example, in a lithography method, a resist film is formed on a support such as a substrate using a resist material containing a base component such as a resin; the resist film is selectively exposed to a radial ray such as light, electron beam or the like; and developing treatment is conducted to form a resist pattern having a predetermined shape on the resist film. Further, using the resist pattern as a mask, the substrate is processed by etching, so as to produce a semiconductor or the like.

The resist material is classified into a positive-type and a negative-type. A resist material in which the exposed portions exhibits increased solubility in a developing solution is called a positive-type. On the other hand, a resist material in which the exposed portions exhibit decreased solubility in a developing solution is called a negative-type.

In general, an aqueous alkali solution (alkali developing solution) such as an aqueous solution of tetramethylammonium hydroxide (TMAH) is used as the developing solution. Alternatively, an organic solvent such as an aromatic solvent, an aliphatic hydrocarbon solvent, an ether solvent, a ketone solvent, an ester solvent, an amide solvent or an alcohol solvent is used as the developing solution.

Advances in lithography techniques have led to progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam (EB), extreme ultraviolet radiation (EUV), and X ray.

As the wavelength of the exposure source becomes shorter, resist materials are required to have lithography properties such as a high resolution capable of reproducing patterns of minute dimensions, and a high level of sensitivity to these types of exposure light sources. As resist materials which satisfy such requirements, chemically amplified resists are known.

As a chemically amplified composition, a composition including a base material component that exhibits a changed solubility in a developing solution under the action of acid and an acid-generator component that generates acid upon exposure is generally used. For example, in the case where an alkali developing solution is used as a developing solution (alkali developing process), a base component which exhibits increased solubility in an alkali developing solution under action of acid is used.

Conventionally, a resin (base resin) is typically used as the base component of a chemically amplified resist composition. Currently, resins that contain structural units derived from (meth)acrylate esters within the main chain (acrylic resins) are now widely used as base resins for chemically amplified resist compositions that use ArF excimer laser lithography, as they exhibit excellent transparency in the vicinity of 193 nm In general, the base resin for a chemically amplified resist composition contains a plurality of kinds of structural units for improving lithography properties and the like. When the base resin is an acrylic resin, as the acid decomposable group, in general, resins in which the carboxy group of (meth)acrylic acid or the like is protected with an acid dissociable group such as a tertiary alkyl group or an acetal group are used.

For example, referring to Patent Literature 1, it is disclosed that an alkali-insoluble or alkali-hardly-soluble polymer containing 2 or more structural units including a structural unit containing a specific acid decomposable group is used in improving properties useful for minute processing.

Further, referring to Patent Literature 2, it is disclosed that the solubility of the acid decomposable group can be increased by using a specific photoacid generator in which the acid strength has been increased.

However, not only in the formation of a minute pattern for increasing the degree of integration of an integrated circuit chip, in the formation of a minute pattern, it is important to uniformly miniaturize a resist pattern. In this regard, critical dimension (CD) refers to the dimension (width of an interconnect line, contact, trench or the like) of the smallest geometrical feature in the formation of a semiconductor device. For forming a uniform resist pattern, it is required to effectively control the deviation of CD.

Further, a resist composition is required to have improved exposure latitude (EL), so that a clear pattern can be formed even when there is shortage or excess of exposure in the formation of a resist pattern.

DOCUMENTS OF RELATED ART

Patent Literature

[Patent Literature 1] Japanese Patent No. 5708500
[Patent Literature 2] Japanese Patent No. 5747311

SUMMARY OF THE INVENTION

The present invention takes the above circumstances into consideration, with an object of providing a resist composition capable of forming a resist pattern in which EL is improved, and deviation of maximum/minimum CD is reduced in the formation of a contact hole (CH); and a method of forming a resist pattern using the resist composition.

Another object of the present invention is to provide a resist composition which may be used in either negative-tone development or positive-tone development without any problems.

As a result of the studies of the present inventors, they have found that the above problems may be solved when a resist composition contains a polymer having a specific structural unit. The present invention has been completed based on this finding.

Further, as a result of the studies of the present inventors, they have found that the above problems may be solved when a resist composition contains an acid-generator component having a specific anion. The present invention has been completed based on this finding.

A first aspect of the present invention is a resist composition including a component (A) which exhibits changed solubility in a developing solution under action of acid and an acid-generator component (B) which generates acid upon exposure, the component (A) containing a polymeric compound having a structural unit represented by formula (1) shown below and a structural unit represented by general formula (2) shown below.

[Chemical Formula 1]

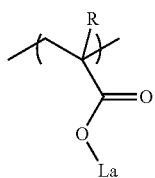

(1)

In formula (1), R represents a hydrogen atom, an alkyl group or a halogenated alkyl group; La is selected from formula (1-1) or (1-2) shown below:

[Chemical Formula 2]

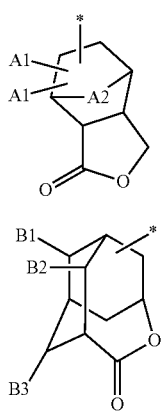

(1-1)

(1-2)

wherein "*" represents a valence bond; each A1 independently represents a hydrogen atom, an alkyl group, an alkoxy group, a halogenated alkyl group, a hydroxy group, —COOR', —OC(=O)R', a hydroxyalkyl group or a cyano group; A2 represents an oxygen atom (—O—), a sulfur atom (—S—) or an alkylene group containing an oxygen atom or a sulfur atom; B1, B2 and B3 each independently represents a hydrogen atom, an alkyl group, an alkoxy group, a halogenated alkyl group, a hydroxy group, —COOR', —OC(=O)R', a hydroxyalkyl group or a cyano group; R' represents a hydrogen atom or an alkyl group.

[Chemical Formula 3]

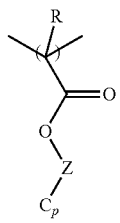

Formula (2)

In formula (2), R represents a hydrogen atom, an alkyl group or a halogenated alkyl group; Z represents a single bond or an alkyl group; and $C_p$ is a group represented by general formula (Cp-1) shown below:

[Chemical Formula 4]

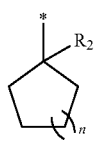

(Cp-1)

wherein $R_2$ represents a tertiary alkyl group, $n_p$ represents a positive integer, and * indicates the bonding position with Z.

A second aspect of the present invention is a method of forming a resist pattern, including: using a resist composition according to the first aspect to form a resist film on a substrate, exposing the resist film, and developing the resist film to form a resist pattern.

According to the present invention, there are provided a resist composition capable of forming a resist pattern in which EL is improved, and deviation of maximum/minimum CD is reduced in the formation of a contact hole; and a method of forming a resist pattern using the resist composition.

MODE FOR CARRYING OUT THE INVENTION

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group within an alkoxy group.

The term "alkylene group" includes linear, branched or cyclic, divalent saturated hydrocarbon, unless otherwise specified.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with a fluorine atom.

The term "structural unit" refers to a monomer unit that contributes to the formation of a polymeric compound (resin, polymer, copolymer).

The expression "may have a substituent" means that a case where a hydrogen atom (—H) is substituted with a monovalent group, or a case where a methylene (—CH$_2$—) group is substituted with a divalent group.

The term "exposure" is used as a general concept that includes irradiation with any form of radiation.

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid (CH$_2$=CH—COOH) has been substituted with an organic group.

The acrylate ester may have the hydrogen atom bonded to the carbon atom on the α-position substituted with a substituent. The substituent (R$^{\alpha 0}$) that substitutes the hydrogen atom bonded to the carbon atom on the α-position is an atom other than hydrogen or a group, and examples thereof include an alkyl group of 1 to 5 carbon atoms and a halogenated alkyl group of 1 to 5 carbon atoms. Further, an acrylate ester having the hydrogen atom bonded to the carbon atom on the α-position substituted with a substituent (R$^{\alpha 0}$) in which the substituent has been substituted with a substituent containing an ester bond (e.g., an itaconic acid diester), or an acrylic acid having the hydrogen atom bonded to the carbon atom on the α-position substituted with a substituent (R$^{\alpha 0}$) in which the substituent has been substituted with a hydroxyalkyl group or a group in which the hydroxy group within a hydroxyalkyl group has been modified (e.g., α-hydroxyalkyl acrylate ester) can be mentioned as an acrylate ester having the hydrogen atom bonded to the carbon atom on the α-position substituted with a substituent. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

<<Resist Composition>>

The resist composition according to the present invention includes a component (A) which exhibits changed solubility in a developing solution under action of acid and an acid-generator component (B) which generates acid upon irradiation of a radial ray.

In the present invention, the resist composition contains a base component (A) (hereafter, sometimes referred to as "component (A)") which exhibits changed solubility in a developing solution by the action of acid.

When a resist film is formed using the resist composition and the formed resist film is subjected to a selective exposure, acid is generated at exposed portions, and the generated acid acts on the component (A) to change the solubility of the component (A) in a developing solution, whereas the solubility of the component (A) in a developing solution is not changed at unexposed portions, thereby generating difference in solubility in a developing solution between exposed portions and unexposed portions. Therefore, by subjecting the resist film to development, the exposed portions of the resist film are dissolved and removed to form a positive-tone resist pattern in the case of a positive resist, whereas the unexposed portions of the resist film are dissolved and removed to form a negative-tone resist pattern in the case of a negative resist.

In the present specification, a resist composition which forms a positive resist pattern by dissolving and removing the exposed portions is called a positive resist composition, and a resist composition which forms a negative resist pattern by dissolving and removing the unexposed portions is called a negative resist composition.

In the present embodiment, the resist composition may be either a positive resist composition or a negative resist composition.

The resist composition according to the present embodiment has acid-generating ability of generating acid upon exposure. Specifically, the resist composition of the present embodiment contains an acid-generator component (B) (hereafter, sometimes referred to as "component (B)") which generates acid upon exposure.

<<Base Component>>

In the present invention, the term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compound used as the base component is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. Hereafter, a "resin" or a "polymeric compound" refers to a polymer having a molecular weight of 1,000 or more.

As the molecular weight of the polymer, the weight average molecular weight in terms of the polystyrene equivalent value determined by gel permeation chromatography (GPC) is used.

As the base component usable in the resist composition of the present embodiment, at least the component (A) is used, and another polymeric compound and/or a low molecular weight compound may be used in combination with the component (A).

[Component (A)]

In the resist composition of the present invention, the component (A) exhibits changed solubility in a developing solution under action of acid, and contains a polymeric compound having a structural unit (a-1) represented by formula (1) and a structural unit (a-2) represented by formula (2).

In the case where a resist film is formed using a resist composition containing the component (A), at least a part of the structure in the structural units (a-1) and (a-2) is cleaved by the action of acid, and the polarity is increased. Therefore, the resist composition of the present embodiment becomes a negative-type in the case where the developing solution is an organic developing solution (solvent developing process), and a positive-type in the case where the developing solution is an alkali developing solution (alkali developing process). Since the polarity of the component (A) changes before and after exposure, by using the component (A), a fine development contrast can be obtained not only in an alkali developing process but also in a solvent developing process.

That is, in the case where a solvent developing process is applied, the component (A) exhibits high solubility in an organic developing solution prior to exposure. When acid is generated upon exposure, polarity is increased by the action of acid, and solubility in an organic developing solution is decreased. Therefore, in the formation of a resist pattern, by conducting selective exposure of a resist film formed by applying the resist composition to a substrate, the exposed portions of the resist film changes from an soluble state to a hardly-soluble state in an organic developing solution, whereas the unexposed portions of the resist film remain soluble in an organic developing solution. As a result, by conducting development using an organic developing solution, a contrast can be made between the exposed portions and unexposed portions, thereby forming a negative resist pattern.

On the other hand, in the case of applying an alkali developing process, the component (A) exhibits low solubility in an alkali developing solution prior to exposure. When acid is generated upon exposure, polarity is increased by the action of acid, and solubility in an alkali developing solution is increased. Therefore, in the formation of a resist pattern, by conducting selective exposure of a resist film formed by applying the resist composition to a substrate, the exposed portions of the resist film change from a hardly-soluble state to a soluble state in an alkali developing solution, whereas the unexposed portions of the resist film remain hardly-soluble in an alkali developing solution, and hence, a positive resist pattern is formed by alkali developing.

Structural Unit (a-1)

The structural unit (a-1) is a structural unit derived from a (meth)acrylate ester containing a lactone-containing cyclic group. The term "lactone-containing cyclic group" refers to a cyclic group including a ring containing a —O—C(=O)— structure. The term "(meth)acrylate ester" refers to an acrylate ester or a methacrylate ester.

The term "lactone-containing cyclic group" refers to a cyclic group including a ring containing a —O—C(=O)— structure, and the term "lactone-containing polycyclic group" refers to a polycyclic group including a ring containing a —O—C(=O)— structure. The lactone ring is counted as the first ring, and groups containing another ring structure are described as polycyclic groups regardless of the structure of the other ring(s). Examples of lactone-containing polycyclic group include a polycyclic group in which another ring structure forms a bicyclo structure or a spiro structure with a lactone ring to form a condensed ring.

By employing the structural unit (a-1), the glass transition temperature (Tg) of the polymeric compound may be enhanced. By using the component (A) having the structural unit (a-1), in the formation of a resist pattern, in particular, diffusion of acid to unexposed portions of the resist film may be suppressed, and a pattern with reduced roughness and fine shape may be formed.

In the case where a resist composition containing a polymeric compound (A) is used for forming a resist film, the lactone-containing group in the structural unit (a-1) is effective in improving the adhesion between the resist film and the substrate, and enhancing the affinity for a developing solution containing water, thereby contributing to improvement of line width roughness (LWR) and development defects.

As the structural unit (a-1), a structural unit represented by formula (1) shown below is preferable.

[Chemical Formula 5]

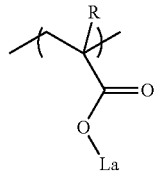

(1)

In formula (1), R represents a hydrogen atom, an alkyl group or a halogenated alkyl group; La is selected from formula (1-1) or (1-2) shown below:

[Chemical Formula 6]

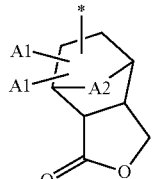

(1-1)

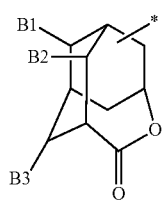

(1-2)

wherein "*" represents a valence bond; each A1 independently represents a hydrogen atom, an alkyl group, an alkoxy group, a halogenated alkyl group, a hydroxy group, —COOR', —OC(=O)R', a hydroxyalkyl group or a cyano group; A2 represents an oxygen atom (—O—), a sulfur atom (—S—) or an alkylene group containing an oxygen atom or a sulfur atom; B1, B2 and B3 each independently represents a hydrogen atom, an alkyl group, an alkoxy group, a halogenated alkyl group, a hydroxy group, —COOR', —OC(=O)R', a hydroxyalkyl group or a cyano group; R' represents a hydrogen atom or an alkyl group.

In the case of forming a resist film, the polymeric compound (A) containing the lactone group having the structure represented by formula (1-1) or (1-2) is effective in improving the adhesion between the resist film and the substrate, and enhancing the affinity for a developing solution containing water, thereby exhibiting the effect of improving EL and maximum/minimum CD in the formation of CH.

In formula (1), R represents a hydrogen atom, an alkyl group or a halogenated alkyl group.

The alkyl group for R is preferably a linear or branched alkyl group of 1 to 5 carbon atoms, and specific examples include a methyl group, an ethyl group, an n-propyl group, an isopropyl group, an n-butyl group, an isobutyl group, a tert-butyl group, a pentyl group, an isopentyl group, and a neopentyl group.

Examples of the halogenated alkyl group for R include groups in which part or all of the hydrogen atoms within the aforementioned alkyl groups has been substituted with a halogen atom. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and in terms of industrial availability, a hydrogen atom or a methyl group is more preferable, and a methyl group is still more preferable.

In formula (1), La is a polycyclic lactone group. More particularly, La is selected from formula (1-1) or (1-2) shown below.

[Chemical Formula 7]

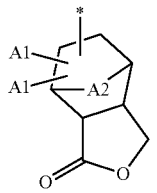

(1-1)

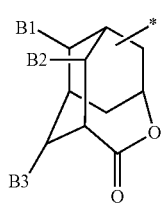

(1-2)

wherein "*" represents a valence bond; each A1 independently represents a hydrogen atom, an alkyl group, an alkoxy group, a halogenated alkyl group, a hydroxy group, —COOR', —OC(=O)R', a hydroxyalkyl group or a cyano group; A2 represents an oxygen atom (—O—), a sulfur atom (—S—) or an alkylene group containing an oxygen atom or a sulfur atom; B1, B2 and B3 each independently represents a hydrogen atom, an alkyl group, an alkoxy group, a halogenated alkyl group, a hydroxy group, —COOR', —OC(=O)R', a hydroxyalkyl group or a cyano group; R' represents a hydrogen atom or an alkyl group.

The alkyl group for A1 is preferably an alkyl group of 1 to 6 carbon atoms. The alkyl group is preferably a linear alkyl group or a branched alkyl group. Specific examples include a methyl group, an ethyl group, an n-propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is most preferable.

The alkoxy group for A1 is preferably an alkoxy group of 1 to 6 carbon atoms. The alkoxy group is preferably a linear or branched alkoxy group. Specific examples of the alkoxy groups include the aforementioned alkyl groups for A1 having an oxygen atom (—O—) bonded thereto.

Examples of the halogenated alkyl group for A1 include groups in which part or all of the hydrogen atoms within the aforementioned alkyl group for A1 has been substituted with the aforementioned halogen atoms. Examples of the halogen atom include a fluorine atom, a chlorine atom, a bromine atom and an iodine atom, and a fluorine atom is preferable. As the halogenated alkyl group, a fluorinated alkyl group is preferable, and a perfluoroalkyl group is particularly desirable.

Regarding —COOR' and —OC(=O)R' for A1, R' represents a hydrogen atom or an alkyl group.

The alkyl group for R' may be linear, branched or cyclic, and preferably has 1 to 15 carbon atoms. When R' represents a linear or branched alkyl group, it is preferably an alkyl group of 1 to 10 carbon atoms, more preferably an alkyl group of 1 to 5 carbon atoms, and most preferably a methyl group or an ethyl group. When R' is a cyclic alkyl group (cycloalkyl group), it preferably has 3 to 15 carbon atoms, more preferably 4 to 12 carbon atoms, and most preferably 5 to 10 carbon atoms. Specific examples include groups in which one or more hydrogen atoms have been removed from a monocycloalkane or a polycycloalkane such as a bicycloalkane, tricycloalkane or tetracycloalkane which may or may not be substituted with a fluorine atom or a fluorinated alkyl group. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

The hydroxyalkyl group for A1 preferably has 1 to 6 carbon atoms, and specific examples thereof include the alkyl groups for A1 in which at least one hydrogen atom has been substituted with a hydroxy group.

In formula (1-1), A2 represents an oxygen atom (—O—), a sulfur atom (—S—) or an alkylene group containing an oxygen atom or a sulfur atom; B1, B2 and B3 each independently represents a hydrogen atom, an alkyl group, an alkoxy group, a halogenated alkyl group, a hydroxy group, —COOR', —OC(=O)R', a hydroxyalkyl group or a cyano group.

As the alkylene group for A2, a linear or branched alkylene group is preferable, and examples thereof include a methylene group, an ethylene group, an n-propylene group and an isopropylene group. In the case where the alkylene group contains an oxygen atom or a sulfur atom, specific examples include groups in which —O— or —S— is present on the terminal of the alkylene group or between carbon atoms, and examples thereof include —O—CH$_2$—, —CH$_2$—O—CH$_2$—, —S—CH$_2$—, and —CH$_2$—S—CH$_2$—. As A2, an alkylene group of 1 to 5 carbon atoms or —O— is preferable, more preferably an alkylene group of 1 to 5 carbon atoms, and most preferably a methylene group.

In formula (1-2), B1, B2 and B3 are the same as defined for A1 in formula (1-1).

In formula (1-1), it is preferable that A1 is a hydrogen atom and A2 is a methylene group. In formula (1-2), it is preferable that each of B1, B2 and B3 is a hydrogen atom.

Specific examples of groups represented by formulae (1-1) and (1-2) are shown below.

[Chemical Formula 8]

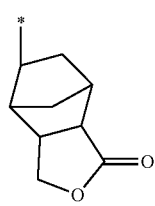

(1-1-a)

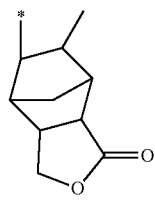

(1-1-b)

-continued

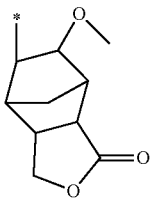
(1-1-c)

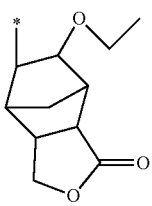
(1-1-d)

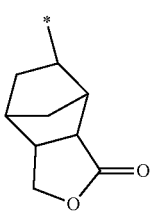
(1-1-e)

[Chemical Formula 9]

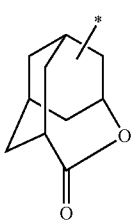
(1-2-a)

In the specific examples of formula (1-1), among groups represented by formulae (1-1-a) to (1-1-e), in particular, a group represented by formula (1-1-a) is preferable. In the specific examples of formula (1-2), a group represented by formula (1-2-a) is preferable.

Specific examples of the structural unit (a-1) are shown below.

[Chemical Formula 10]

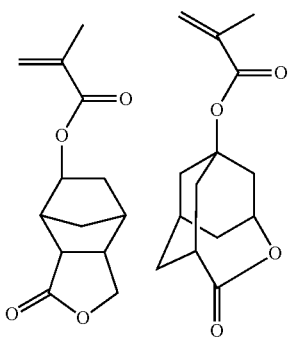

The amount of the structural unit (a-1) within the component (A) based on the combined total of all structural units contained in the component (A) is preferably 5 to 70 mol %, more preferably 10 to 60 mol %, still more preferably 20 to 60 mol %, and most preferably 20 to 50 mol %.

When the amount of the structural unit (a-1) is at least as large as the lower limit of the above-mentioned range, in the formation of a resist pattern, diffusion of acid to unexposed portions of the resist film may be suppressed, a resist pattern with improved EL and shape may be formed, and deviation of maximum/minimum CD may be improved in the formation of CH. On the other hand, when the amount of the structural unit (a-1) is no more than the upper limit of the above-mentioned range, a good balance may be achieved with the other structural units, a resist pattern formed may have excellent lithography properties, and a fine shape may be more reliably obtained.

Structural Unit (a-2)

The structural unit (a-2) is a structural unit containing an acid decomposable group that exhibits increased polarity by the action of acid.

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of an acid to form a polar group.

Examples of the polar group include a carboxy group, a hydroxy group, an amino group and a sulfo group ($-SO_3H$). Among these, a sulfo group or a polar group containing $-OH$ in the structure thereof (hereafter, referred to as "OH-containing polar group") is preferable, a sulfo group, a carboxy group or a hydroxy group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

Here, the "acid dissociable group" includes:

(i) a group in which the bond between the acid dissociable group and the adjacent atom is cleaved by the action of acid; and (ii) a group in which one of the bonds is cleaved by the action of acid, and then a decarboxylation reaction occurs, thereby cleaving the bond between the acid dissociable group and the adjacent atom.

It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A) is increased. By the increase in the polarity, the solubility in an alkali developing solution changes and, the solubility in an organic developing solution is relatively decreased.

The acid dissociable group is not particularly limited, and any of the groups that have been conventionally proposed as acid dissociable groups for the base resins of chemically amplified resists can be used.

As the structural unit (a-2), a structural unit represented by formula (2) shown below is preferable.

[Chemical Formula 11]

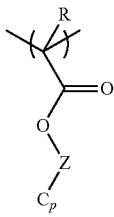

Formula (2)

In formula (2), R represents a hydrogen atom, an alkyl group or a halogenated alkyl group; Z represents a single bond or an alkyl group; and $C_p$ is a group represented by general formula (Cp-1) shown below:

[Chemical Formula 12]

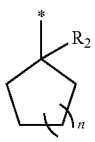

(Cp-1)

wherein $R_2$ represents a tertiary alkyl group, $n_p$ represents a positive integer, and * indicates the bonding position with Z.

The alkyl group for R is preferably a linear or branched alkyl group of 1 to 5 carbon atoms, and specific examples include a methyl group, an ethyl group, an n-propyl group, an isopropyl group, an n-butyl group, an isobutyl group, a tert-butyl group, a pentyl group, an isopentyl group, and a neopentyl group.

In formula (2), examples of the halogenated alkyl group for R include groups in which part or all of the hydrogen atoms within the aforementioned alkyl groups has been substituted with a halogen atom. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and in terms of industrial availability, a hydrogen atom or a methyl group is more preferable, and a methyl group is still more preferable.

In formula (2), Z represents, as a linking group, a single bond or an alkyl group.

As the alkyl group for Z, the alkyl group having 1 to 5 carbon atoms defined for R may be mentioned.

In formula (2), $C_p$ is a group represented by the aforementioned general formula (Cp-1).

In $C_p$, $R_2$ represents a tertiary alkyl group, and the tertiary alkyl group preferably has 4 to 10 carbon atoms, more preferably 4 to 6 carbon atoms, and a tert-butyl group is most preferable.

In $C_p$, $n_p$ represents a positive integer, preferably 1 to 10, more preferably 1 to 5, and most preferably 1 to 3.

In formula (2), $R_2$ is preferably a tert-butyl group, and $n_p$ is preferably 1.

The structural unit (a-2) is a structural unit containing an acid decomposable group that exhibits increased polarity by the action of acid.

In the structural unit (a-2), the acid decomposable group requires relatively low activation energy as compared to other acid decomposable groups when at least a part of the bond in the structure of the acid decomposable group is cleaved by the action of acid (i.e., the acid decomposable group is more reliably dissociated by the action of acid).

The acid decomposable group in the structural unit (a-2) is decomposed by the action of acid to generate a polar group (carboxy group). That is, the acid decomposable group may be referred to as a group in which the polar group is protected by an acid dissociable group having a specific monocyclic structure.

In the present invention, preferable examples of the structural unit (a-2) contained in the component (A) are as follows.

[Chemical Formula 13]

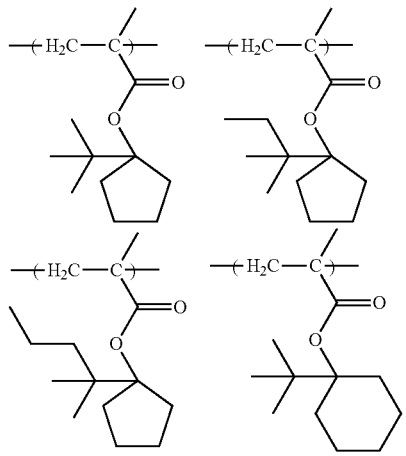

The amount of the structural unit (a-2) based on the combined total of all structural units including the structural unit (a-2) is preferably 5 to 70 mol %, more preferably 10 to 60 mol %, still more preferably 20 to 60 mol %, and most preferably 20 to 50 mol %.

When the amount of the structural unit (a-2) is at least as large as the lower limit of the above-mentioned range, various lithography properties such as sensitivity, resolution and LWR are improved. On the other hand, when the amount of the structural unit (a-2) is no more than the upper limit of the above-mentioned range, a good balance can be achieved with the other structural units.

Additional Component

In the resist composition of the present embodiment, as the component (A), a base component (hereafter, sometimes referred to as "component (A')") which exhibits decreased solubility in an organic solvent contained in an organic developing solution which does not fall under the definitions of the aforementioned (a-1) and (a-2) may be used in combination.

The component (A') is not particularly limited, and any of the multitude of conventional base components used within chemically amplified resist compositions (e.g., base resins used within chemically amplified resist compositions for ArF excimer lasers or KrF excimer lasers, preferably ArF excimer lasers) can be used.

In the resist composition of the present embodiment, as the component (A'), one kind of compound may be used, or two or more kinds of compounds may be used in combination.

In the resist composition of the present embodiment, the amount of the component (A') may be appropriately adjusted depending on the thickness of the resist film to be formed, and the like.

<<Acid-Generator Component>>

The resist composition of the present invention contains a component (B) which is an acid-generator component that generates acid upon exposure. As shown below, the component (B) contains 1 kind of anion moiety and 1 kind of cation moiety, and may include one or more acid generators.

{Anion Moiety}

The component (B) includes an acid generator having an anion represented by formula (3) shown below.

[Chemical Formula 14]

$$Y-COO-(CH_2)_n-CHF-CF_2-SO_3^- \qquad (3)$$

In the formula, Y represents a monocyclic or polycyclic group of 5 to 30 carbon atoms which may have a substituent, an alkyl group which may have a substituent, or an alkenyl group which may have a substituent; and n represents an integer of 1 to 5.

The cyclic hydrocarbon group (which may have a substituent) for Y may be an aromatic hydrocarbon group or an aliphatic hydrocarbon group. An "aliphatic hydrocarbon group" refers to a hydrocarbon group that has no aromaticity. The aliphatic hydrocarbon group may be either saturated or unsaturated, but in general, the aliphatic hydrocarbon group is preferably saturated.

The aromatic hydrocarbon group for Y is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Specific examples of the aromatic ring contained in the aromatic hydrocarbon group for Y include benzene, fluorene, naphthalene, anthracene, phenanthrene, biphenyl, or an aromatic hetero ring in which part of the carbon atoms constituting any of these aromatic rings have been substituted with a hetero atom. Examples of the hetero atom within the aromatic hetero rings include an oxygen atom, a sulfur atom and a nitrogen atom.

Specific examples of the aromatic hydrocarbon group for Y include a group in which 1 hydrogen atom has been removed from the aforementioned aromatic ring (an aryl group, such as a phenyl group or a naphthyl group); and a group in which 1 hydrogen atom of the aforementioned aromatic ring has been substituted with an alkylene group (e.g., a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2, and most preferably 1.

Examples of the cyclic aliphatic hydrocarbon group for Y include aliphatic hydrocarbon groups containing a ring in the structure thereof.

Examples of the aliphatic hydrocarbon group containing a ring in the structure thereof include an alicyclic hydrocarbon group (a group in which 1 hydrogen atom has been removed from an aliphatic hydrocarbon ring); a group in which an alicyclic hydrocarbon group is bonded to a terminal of a linear or branched aliphatic hydrocarbon group; and a group in which an alicyclic hydrocarbon group is present between carbon atoms of a linear or branched aliphatic hydrocarbon group.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic alicyclic hydrocarbon group, a group in which one or more hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which one or more hydrogen atoms have been removed from a polycycloalkane is preferable, and the polycyclic group preferably has 7 to 30 carbon atoms. Among polycycloalkanes, a polycycloalkane having a bridged ring polycyclic skeleton, such as adamantane, norbornane, isobornane, tricyclodecane or tetracyclododecane, and a polycycloalkane having a condensed ring polycyclic skeleton, such as a cyclic group having a steroid skeleton are preferable.

Among these examples, as the cyclic aliphatic hydrocarbon group for Y, a group in which one or more hydrogen atoms have been removed from a monocycloalkane or a polycycloalkane is preferable, a group in which one or more hydrogen atoms have been removed from a polycycloalkane is more preferable, an adamantyl group or a norbornyl group is still more preferable, and an adamantyl group is most preferable.

The linear or branched aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The cyclic hydrocarbon group for Y may contain a hetero atom such as a heterocycle. Specific examples include lactone-containing cyclic groups represented by the aforementioned general formulae (a2-r-1) to (a2-r-6), the —$SO_2$— containing polycyclic groups represented by the aforementioned general formulae (a5-r-1) to (a5-r-2), and other heterocyclic groups represented by chemical formulae (r-hr-1) to (r-hr-16) shown below.

[Chemical Formula 15]

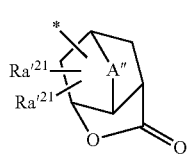

(a2-r-1)

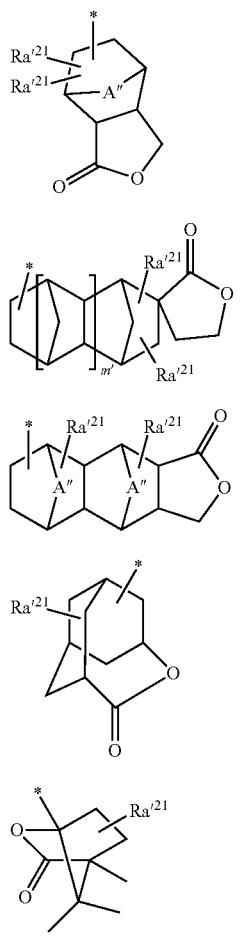
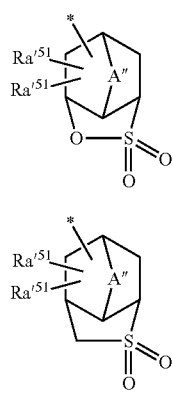
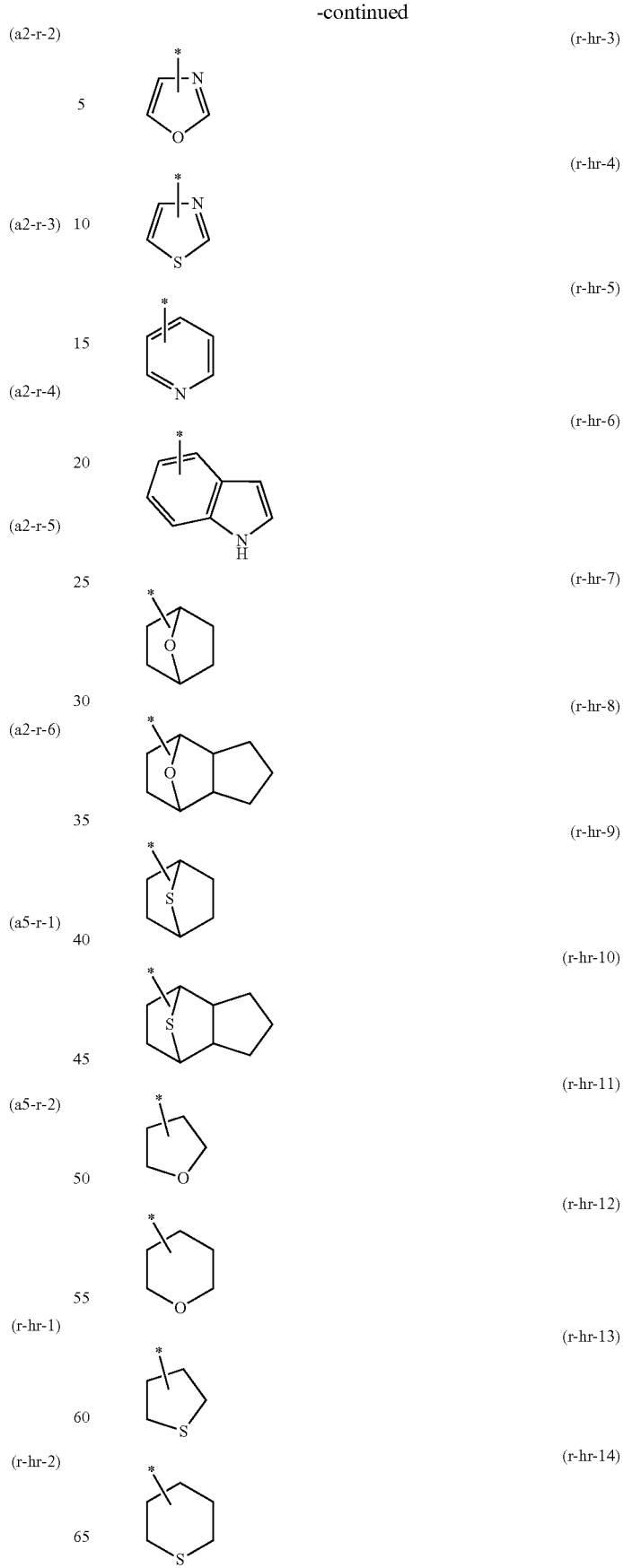

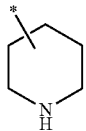
(r-hr-15)

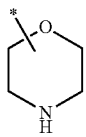
(r-hr-16)

In general formulae (a2-r-1) to (a2-r-6), each $Ra'^{21}$ independently represents a hydrogen atom, an alkyl group, an alkoxy group, a halogen atom, a halogenated alkyl group, a hydroxy group, —COOR$_{02}$", —OC(=O)R$_{02}$", a hydroxyalkyl group or a cyano group; R$_{02}$" represents a hydrogen atom, an alkyl group or a lactone-containing polycyclic group; A" represents an oxygen atom (—O—), a sulfur atom (—S—) or an alkylene group of 1 to 5 carbon atoms which may contain an oxygen atom or a sulfur atom; and m' represents 0 or 1.

In formulae (a2-r-1) to (a2-r-6), the alkyl group for $Ra'^{21}$ is preferably an alkyl group of 1 to 6 carbon atoms. The alkyl group is preferably a linear alkyl group or a branched alkyl group. Specific examples include a methyl group, an ethyl group, an n-propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is most preferable.

The alkoxy group for $Ra'^{21}$ is preferably an alkoxy group of 1 to 6 carbon atoms. The alkoxy group is preferably a linear or branched alkoxy group. Specific examples of the alkoxy groups include the aforementioned alkyl groups for $Ra'^{21}$ having an oxygen atom (—O—) bonded thereto.

As examples of the halogen atom for $Ra'^{21}$, a fluorine atom, chlorine atom, bromine atom and iodine atom can be given. Among these, a fluorine atom is preferable.

Examples of the halogenated alkyl group for $Ra'^{21}$ include groups in which part or all of the hydrogen atoms within the aforementioned alkyl group for $Ra'^{21}$ has been substituted with the aforementioned halogen atoms. As the halogenated alkyl group, a fluorinated alkyl group is preferable, and a perfluoroalkyl group is particularly desirable.

With respect to —COOR$_{02}$" and —OC(=O)R$_{02}$" for $Ra'^{21}$, R$_{02}$" represents a hydrogen atom, an alkyl group or a lactone-containing polycyclic group.

The alkyl group for R$_{02}$" may be linear, branched or cyclic, and preferably has 1 to 15 carbon atoms. When R$_{02}$" represents a linear or branched alkyl group, it is preferably an alkyl group of 1 to 10 carbon atoms, more preferably an alkyl group of 1 to 5 carbon atoms, and most preferably a methyl group or an ethyl group. When R$_{02}$" is a cyclic alkyl group (cycloalkyl group), it preferably has 3 to 15 carbon atoms, more preferably 4 to 12 carbon atoms, and most preferably 5 to 10 carbon atoms. Specific examples include groups in which one or more hydrogen atoms have been removed from a monocycloalkane or a polycycloalkane such as a bicycloalkane, tricycloalkane or tetracycloalkane which may or may not be substituted with a fluorine atom or a fluorinated alkyl group. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

Examples of the lactone-containing polycyclic group for R$_{02}$" include groups represented by the aforementioned general formulae (a2-r-1) to (a2-r-6).

The hydroxyalkyl group for $Ra'^{21}$ preferably has 1 to 6 carbon atoms, and specific examples thereof include the alkyl groups for $Ra'^{21}$ in which at least one hydrogen atom has been substituted with a hydroxy group.

In formulae (a2-r-1), (a2-r-2) and (a2-r-4), as the alkylene group of 1 to 5 carbon atoms represented by A", a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, S—CH$_2$— and —CH$_2$—S—CH$_2$—. As A", an alkylene group of 1 to 5 carbon atoms or —O— is preferable, more preferably an alkylene group of 1 to 5 carbon atoms, and most preferably a methylene group.

In general formulae (a5-r-1) to (a5-r-2), each $Ra'^{51}$ independently represents a hydrogen atom, an alkyl group, an alkoxy group, a halogen atom, a halogenated alkyl group, a hydroxy group, —COOR$_{05}$", —OC(=O)R$_{05}$", a hydroxyalkyl group or a cyano group; R$_{05}$" represents a hydrogen atom, an alkyl group or an —SO$_2$— containing polycyclic group; and A" represents an oxygen atom (—O—), a sulfur atom (—S—) or an alkylene group of 1 to 5 carbon atoms which may contain an oxygen atom or a sulfur atom.

In general formulae (a5-r-1) to (a5-r-2), A" is the same as defined for A" in general formula (a2-r-1).

Examples of the alkyl group, alkoxy group, halogen atom, halogenated alkyl group and hydroxyalkyl group for Ra' include the same groups as those described above in the explanation of $Ra'^{21}$ in general formulae (a2-r-1) to (a2-r-6).

The alkyl group for R$_{05}$" is the same as defined for the alkyl group for the aforementioned R$_{02}$".

Examples of the —SO$_2$— containing polycyclic group for R$_{05}$" include groups represented by the aforementioned general formulae (a5-r-1) to (a5-r-2).

As the substituent for the cyclic group for Y, an alkyl group, an alkoxy group, a halogen atom, a halogenated alkyl group, a hydroxyl group, a carbonyl group, a nitro group or the like can be used.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, isopropoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

The carbonyl group as the substituent is a group that substitutes a methylene group (—CH$_2$—) constituting the cyclic hydrocarbon group.

The chain-like alkyl group (which may have a substituent) for Y may be linear or branched.

The linear alkyl group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The chain-like alkenyl group (which may have a substituent) for Y may be linear or branched, and preferably has 2 to 10 carbon atoms, more preferably 2 to 5 carbon atoms, still more preferably 2 to 4 carbon atoms, and most preferably 3 carbon atoms. Examples of linear alkenyl groups include a vinyl group, a propenyl group (an allyl group) and a butynyl group. Examples of branched alkenyl groups include a 1-methylvinyl group, a 2-methylvinyl group, a 1-methylpropenyl group and a 2-methylpropenyl group.

Among these examples, as the chain-like alkenyl group, a linear alkenyl group is preferable, a vinyl group or a propenyl group is more preferable, and a vinyl group is most preferable.

As the substituent for the chain-like alkyl group or alkenyl group for Y, an alkoxy group, a halogen atom, a halogenated alkyl group, a hydroxyl group, a carbonyl group, a nitro group, an amino group, a cyclic group for Y or the like can be used.

Among these examples, Y is preferably a cyclic group which may have a substituent or a chain-like alkyl group which may have a substituent, more preferably a cyclic group which may have a substituent, and still more preferably a cyclic hydrocarbon group which may have a substituent.

Among these examples, a phenyl group, a naphthyl group, a group in which one or more hydrogen atoms have been removed from a polycycloalkane, a lactone-containing cyclic group represented by any one of the aforementioned formulae (a2-r-1) to (a2-r-6), an —SO$_2$— containing polycyclic group represented by any one of the aforementioned general formulae (a5-r-1) and (a5-r-2) is preferable, and a group in which one or more hydrogen atoms have been removed from a polycycloalkane or an —SO$_2$— containing polycyclic group represented by any one of the aforementioned general formulae (a5-r-1) to (a5-r-2) is more preferable.

In formula (3), Y is preferably a polycyclic group which may have a hydroxy group as a substituent, or a polycyclic group in which one or more carbon atoms may be substituted with a carbonyl group.

In the present invention, preferable examples of the anion of the component (B) include anions of the following acid generators PAG-1, PAG-2 and PAG-5.

[Chemical Formula 18]

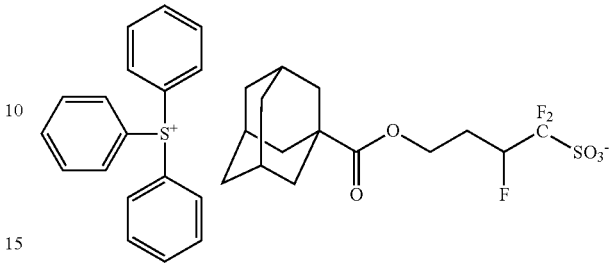

PAG-1

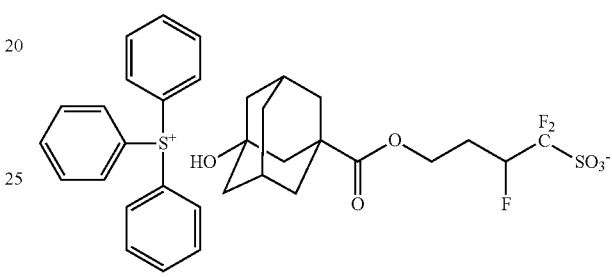

PAG-2

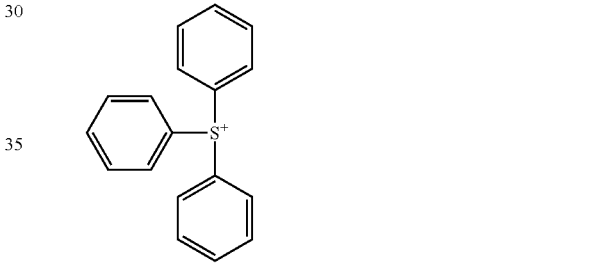

PAG-5

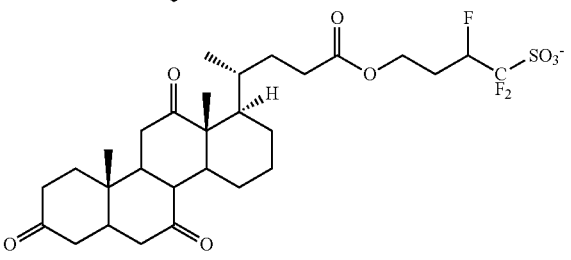

In the present invention, in the case where a component (B) having 3 fluorine atoms (F) as the acid generator, the generated acid has a satisfactory acid strength. As a result, EL is improved, and deviation of maximum/minimum CD is reduced in the formation of CH.

{Cation Moiety}

As the cation moiety of the component (B), there is no particular limitation, and any of the known acid generators used in conventional chemically amplified resist compositions can be used.

Specifically, the cation moiety is an onium cation, and preferable examples thereof include a sulfonium cation and an iodonium cation, and an organic cation represented by any of general formulae (ca-1) to (ca-4) shown below are preferable.

[Chemical Formula 19]

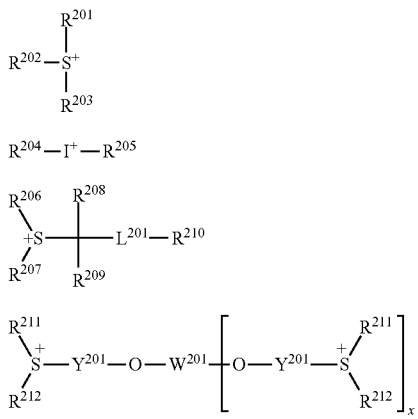

(ca-1)
(ca-2)
(ca-3)
(ca-4)

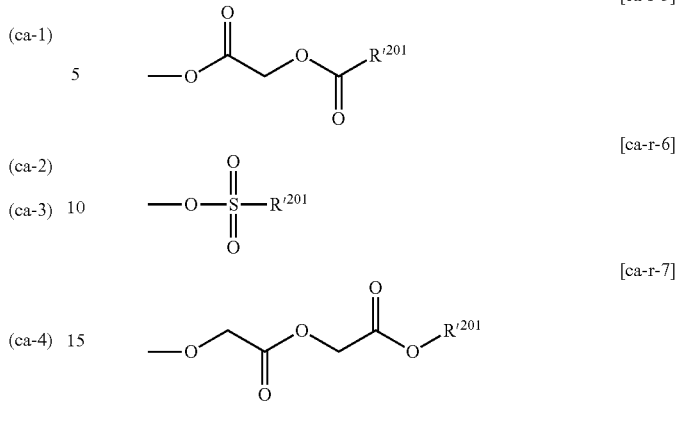

[ca-r-5]
[ca-r-6]
[ca-r-7]

In the formulae, $R^{201}$ to $R^{207}$, $R^{211}$ and $R^{212}$ each independently represents an aryl group, an alkyl group or an alkenyl group, provided that two of $R^{201}$ to $R^{203}$, $R^{206}$ and $R^{207}$, or $R^{211}$ and $R^{212}$ may be mutually bonded to form a ring with the sulfur atom; $R^{208}$ and $R^{209}$ each independently represents a hydrogen atom or an alkyl group of 1 to 5 carbon atoms; $R^{210}$ represents an aryl group which may have a substituent, an alkyl group which may have a substituent, an alkenyl group which may have a substituent, or an —$SO_2$— containing cyclic group which may have a substituent; $L^{201}$ represents —C(=O)— or —C(=O)—O—; each $Y^{201}$ independently represents an arylene group, an alkylene group or an alkenylene group; x represents 1 or 2; and $W^{201}$ represents a linking group having a valency of (x+1).

As the aryl group for $R^{201}$ to $R^{207}$, $R^{211}$ and $R^{212}$, an unsubstituted aryl group of 6 to 20 carbon atoms can be mentioned, and a phenyl group or a naphthyl group is preferable.

The alkyl group for $R^{201}$ to $R^{207}$, $R^{211}$ and $R^{212}$ is preferably a chain-like or cyclic alkyl group having 1 to 30 carbon atoms.

The alkenyl group for $R^{201}$ to $R^{207}$, $R^{211}$ and $R^{212}$ preferably has 2 to 10 carbon atoms.

Specific examples of the substituent which $R^{201}$ to $R^{207}$ and $R^{210}$ to $R^{212}$ may have include an alkyl group, a halogen atom, a halogenated alkyl group, a carbonyl group, a cyano group, an amino group, an aryl group, and groups represented by formulae (ca-r-1) to (ca-r-7) shown below.

[Chemical Formula 20]

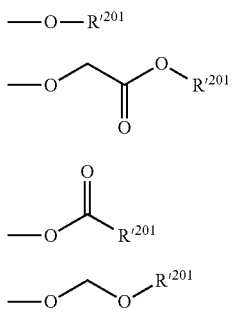

[ca-r-1]
[ca-r-2]
[ca-r-3]
[ca-r-4]

In the formulae, each $R'^{201}$ independently represents a hydrogen atom, a cyclic group which may have a substituent, a chain-like alkyl group which may have a substituent, or a chain-like alkenyl group which may have a substituent.

The cyclic group which may have a substituent, the chain-like alkyl group which may have a substituent or the chain-like alkenyl group which may have a substituent for $R'^{201}$ are the same as defined for the cyclic group which may have a substituent, the chain-like alkyl group which may have a substituent or the chain-like alkenyl group which may have a substituent for Y in the aforementioned formula (3), respectively.

In the case where $R^{201}$ to $R^{203}$, $R^{206}$ and $R^{207}$ or $R^{211}$ and $R^{212}$ are mutually bonded with the sulfur atom to form a ring, the groups may be bonded through a hetero atom such as a sulfur atom, an oxygen atom or a nitrogen atom, or a functional group such as a carbonyl group, —SO—, —$SO_2$—, —$SO_3$—, —COO—, —CONH— or —N($R_N$)— ($R_N$ represents an alkyl group of 1 to 5 carbon atoms). The ring containing the sulfur atom in the skeleton thereof is preferably a 3 to 10-membered ring, and most preferably a 5 to 7-membered ring. Specific examples of the ring formed include a thiophene ring, a thiazole ring, a benzothiophene ring, a thianthrene ring, a dibenzothiophene ring, a 9H-thioxanthene ring, a phenoxathiin ring, a tetrahydrothiophenium ring, and a tetrahydrothiopyranium ring.

$R^{208}$ and $R^{209}$ each independently represents a hydrogen atom or an alkyl group of 1 to 5 carbon atoms, preferably a hydrogen atom or an alkyl group of 1 to 3 carbon atoms, and when $R^{208}$ and $R^{209}$ each represents an alkyl group, $R^{208}$ and $R^{209}$ may be mutually bonded to form a ring.

$R^{210}$ represents an aryl group which may have a substituent, an alkyl group which may have a substituent, an alkenyl group which may have a substituent, or an —$SO_2$— containing cyclic group which may have a substituent.

Examples of the aryl group for $R^{210}$ include an unsubstituted aryl group of 6 to 20 carbon atoms, and a phenyl group or a naphthyl group is preferable.

As the alkyl group for $R^{210}$, a chain-like or cyclic alkyl group having 1 to 30 carbon atoms is preferable.

The alkenyl group for $R^{210}$ preferably has 2 to 10 carbon atoms.

As the —$SO_2$— containing cyclic group for $R^{210}$ which may have a substituent, an "—$SO_2$— containing polycyclic group" is preferable, and a group represented by the aforementioned general formula (a5-r-1) is more preferable.

Each $Y^{201}$ independently represents an arylene group, an alkylene group or an alkenylene group.

Examples of the arylene group for $Y^{201}$ include groups in which one hydrogen atom has been removed from an aryl group given as an example of the aromatic hydrocarbon group for Y in the aforementioned formula (3).

Examples of the alkylene group and alkenylene group for $Y^{201}$ include groups in which one hydrogen atom has been removed from the chain-like alkyl group or the chain-like alkenyl group given as an example of Y in the aforementioned formula (3).

In the formula (ca-4), x represents 1 or 2.

$W^{201}$ represents a linking group having a valency of (x+1), i.e., a divalent or trivalent linking group.

The divalent linking group for $W^{201}$ is preferably a divalent hydrocarbon group optionally having a substituent. The divalent linking group for $W^{201}$ may be linear, branched or cyclic, and cyclic is more preferable. Among these, an arylene group having two carbonyl groups, each bonded to the terminal thereof is preferable. Examples of the arylene group include a phenylene group and a naphthylene group, and a phenylene group is particularly desirable.

As the trivalent linking group for $W^{201}$, a group in which one hydrogen atom has been removed from the aforementioned divalent linking group for $W^{201}$ and a group in which the divalent linking group has been bonded to another divalent linking group can be mentioned. The trivalent linking group for $W^{201}$ is preferably a group in which 2 carbonyl groups are bonded to an arylene group.

Specific examples of preferable cations represented by formula (ca-1) include cations represented by formulae (ca-1-1) to (ca-1-67) shown below.

[Chemical Formula 21]

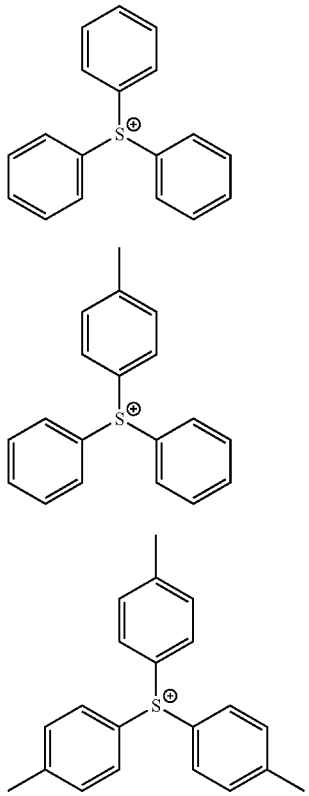

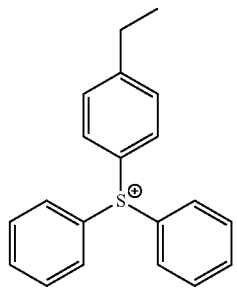

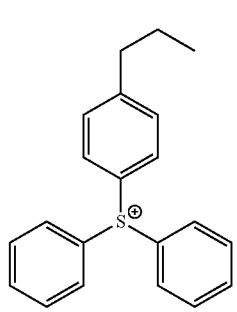

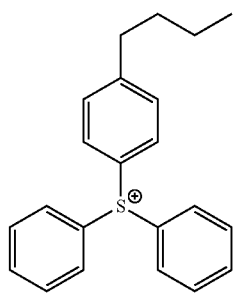

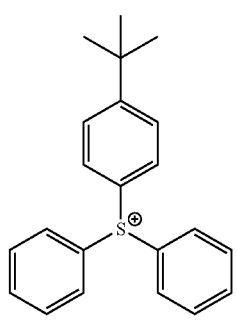

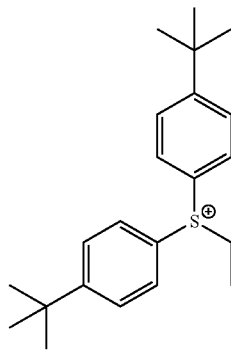

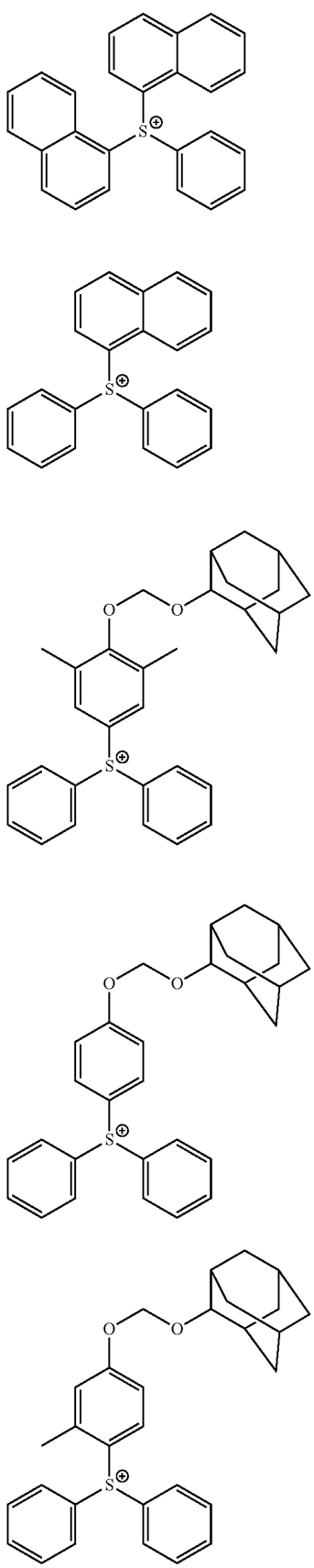
(ca-1-9)
(ca-1-10)
(ca-1-11)
(ca-1-12)
(ca-1-13)
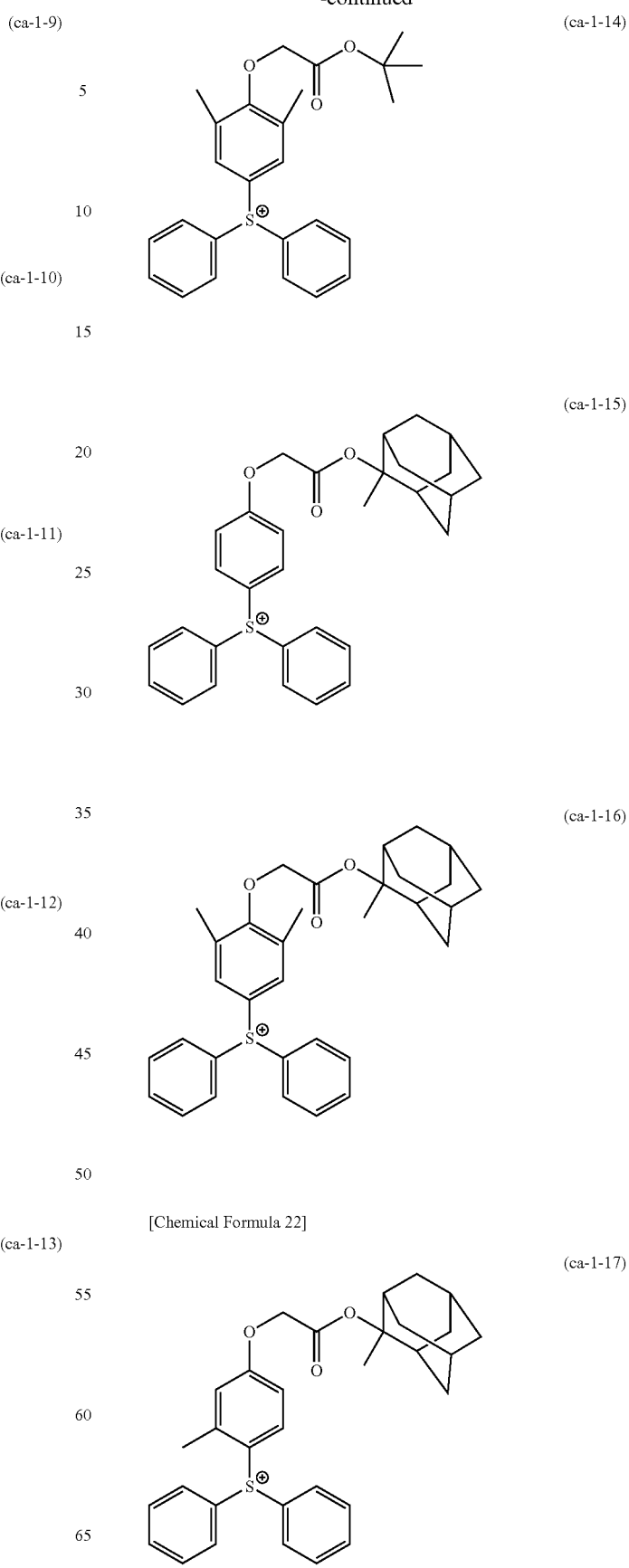
(ca-1-14)
(ca-1-15)
(ca-1-16)
[Chemical Formula 22]
(ca-1-17)

(ca-1-18)
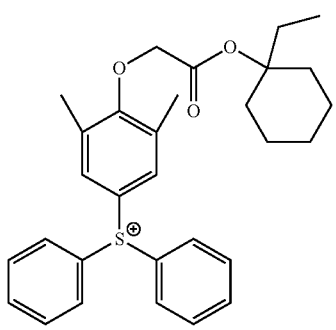
(ca-1-19)
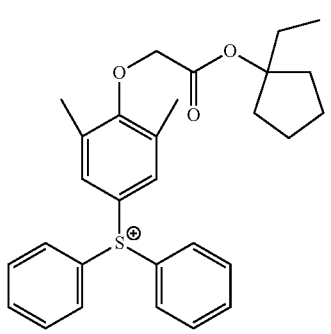
(ca-1-20)
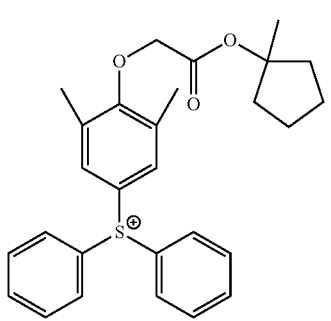
(ca-1-21)
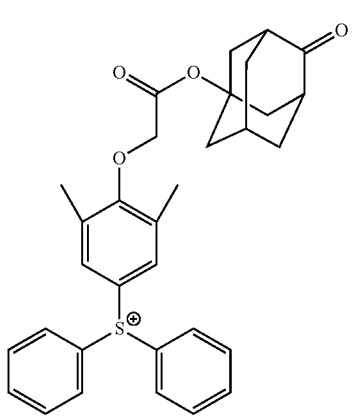
(ca-1-22)
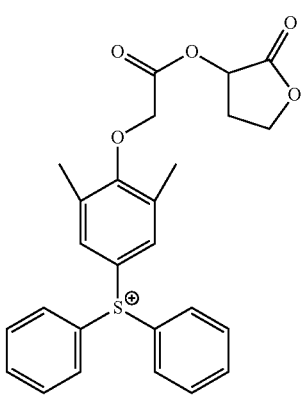
(ca-1-23)
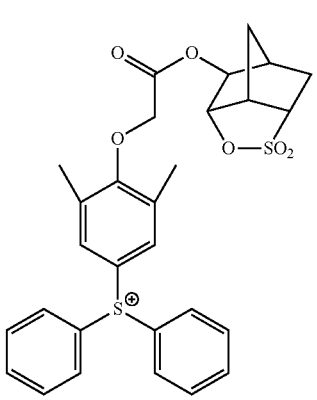
(ca-1-24)
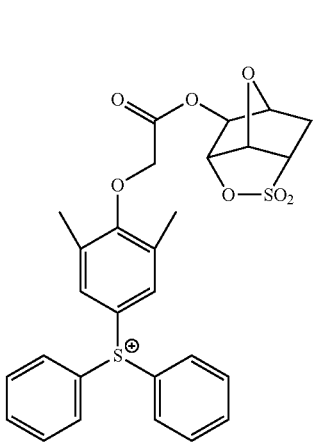
(ca-1-25)
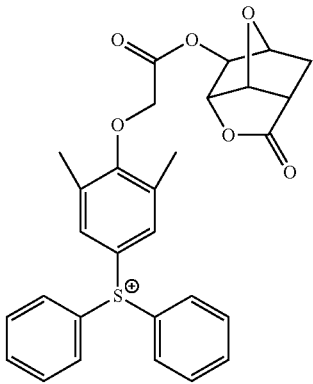

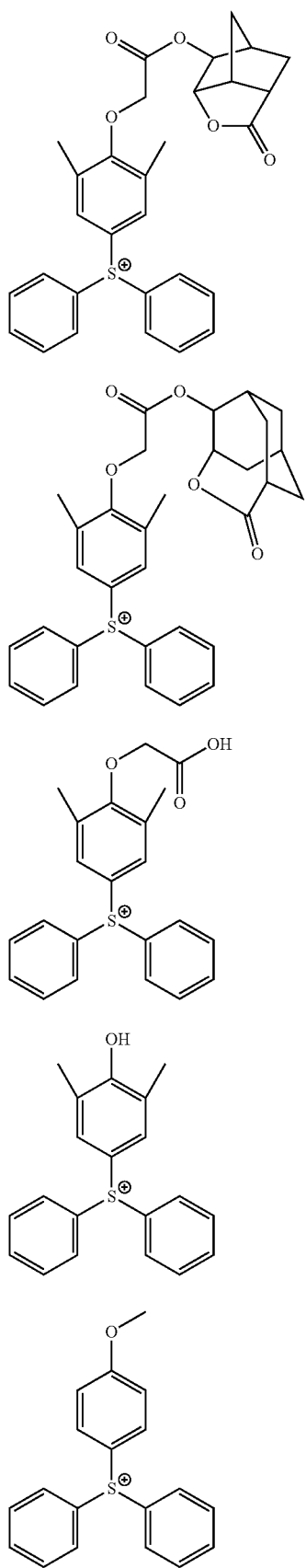
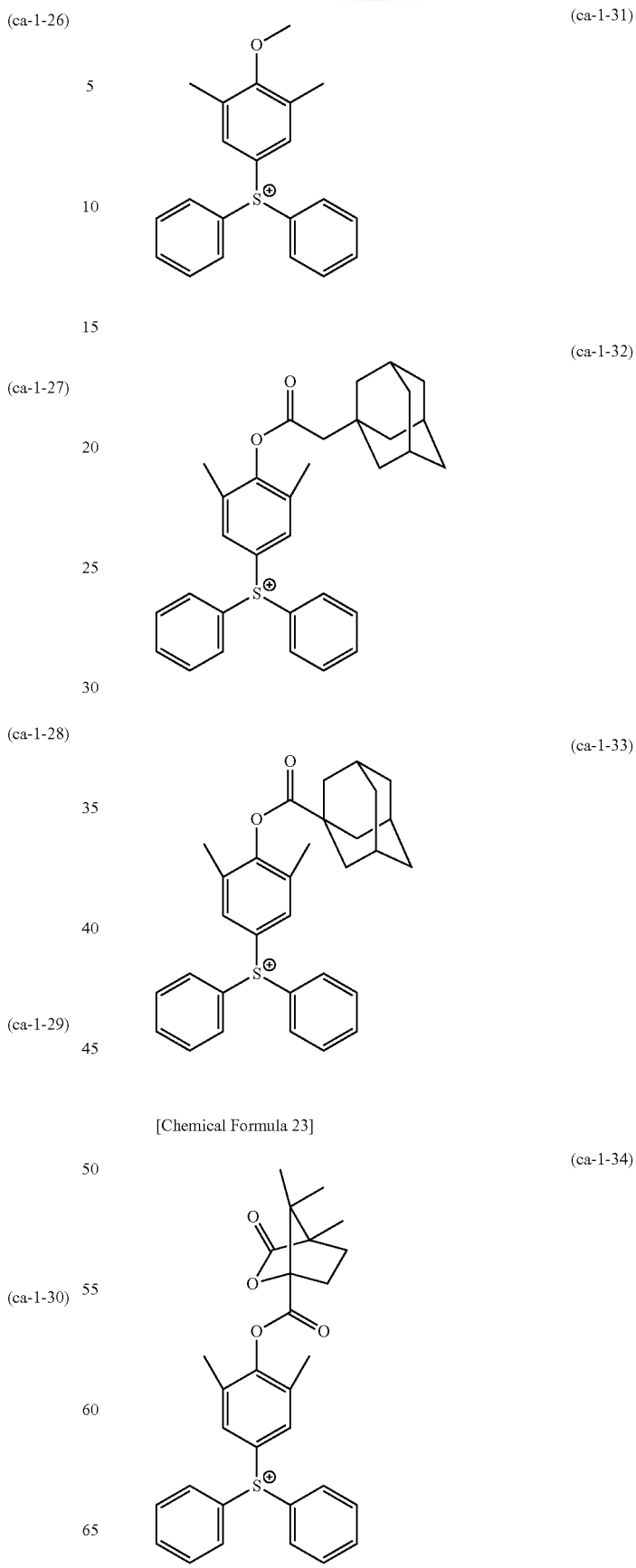
[Chemical Formula 23]

(ca-1-35) 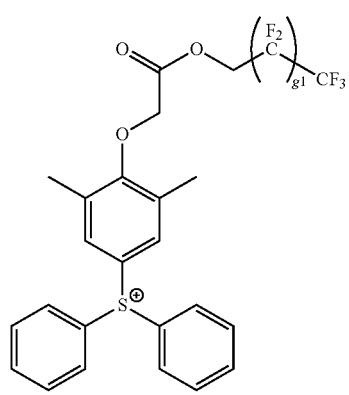
(ca-1-36) 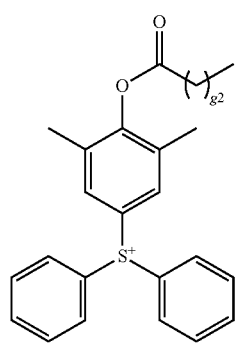
(ca-1-37) 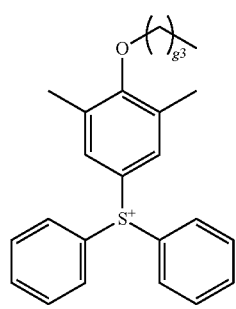
(ca-1-38) 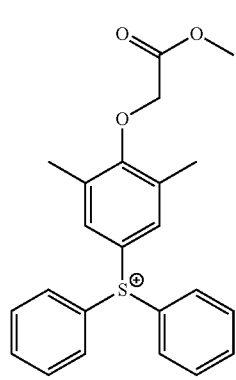
(ca-1-39) 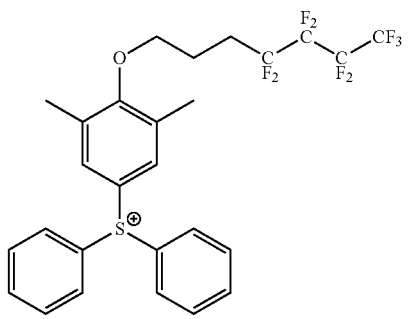
(ca-1-40) 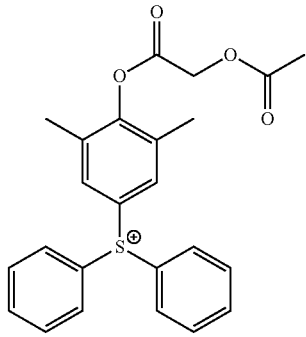
(ca-1-41) 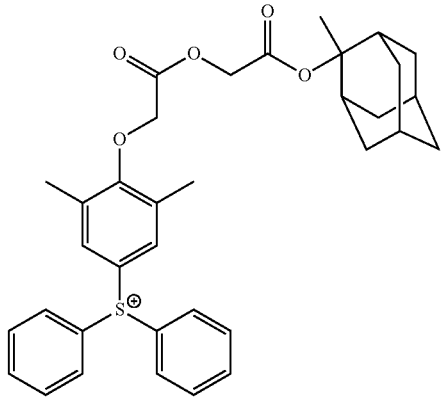
(ca-1-42) 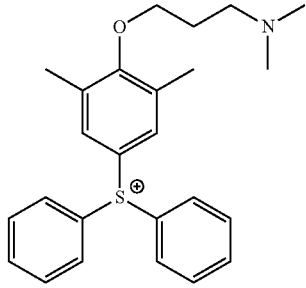
(ca-1-43) 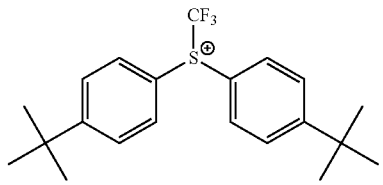

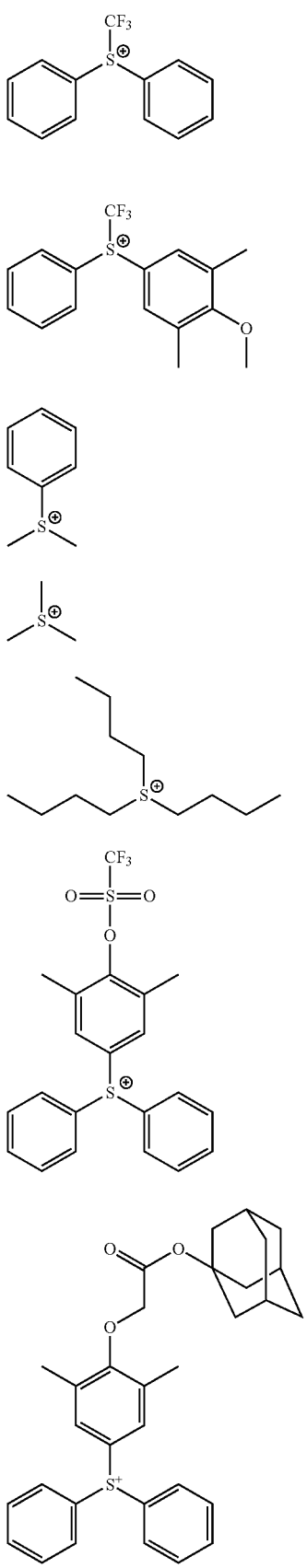
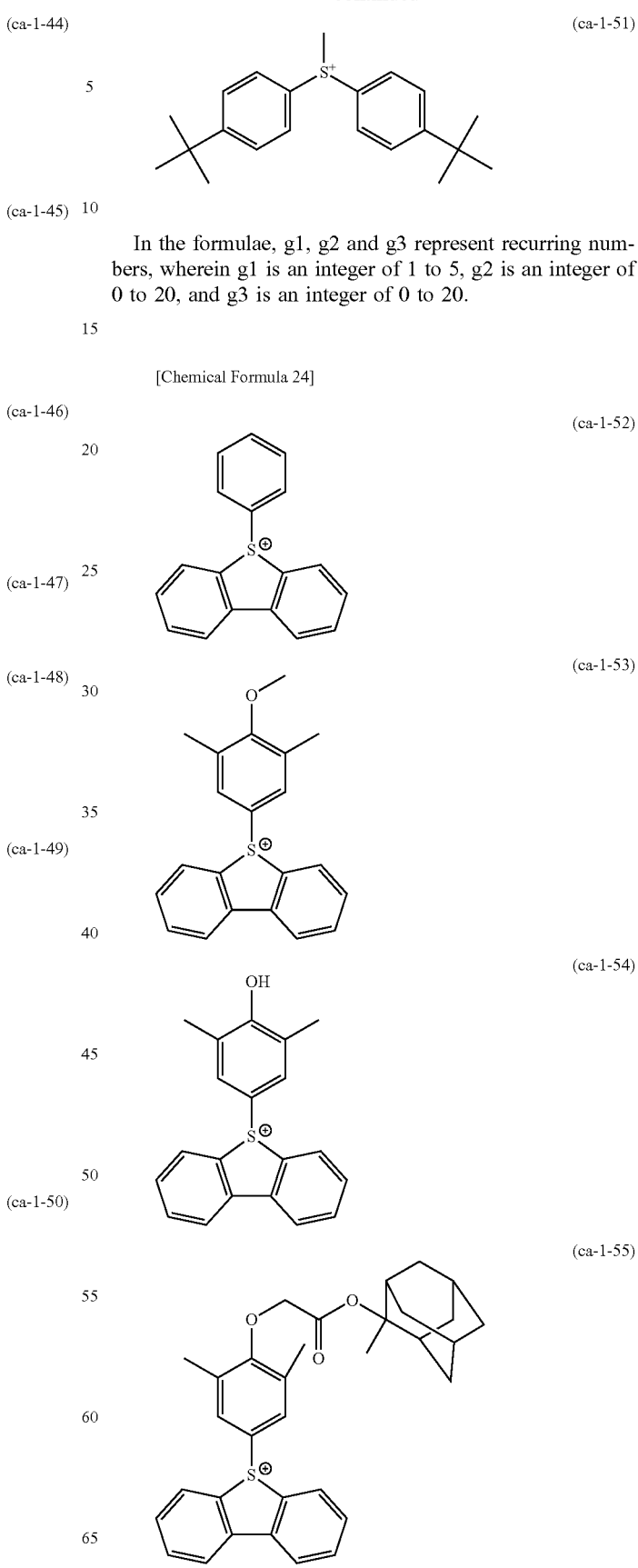
In the formulae, g1, g2 and g3 represent recurring numbers, wherein g1 is an integer of 1 to 5, g2 is an integer of 0 to 20, and g3 is an integer of 0 to 20.
[Chemical Formula 24]

(ca-1-56)
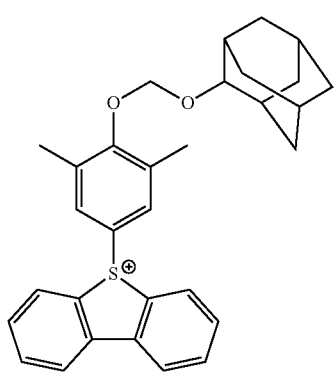
(ca-1-57)
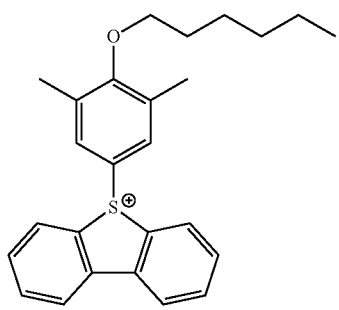
(ca-1-58)
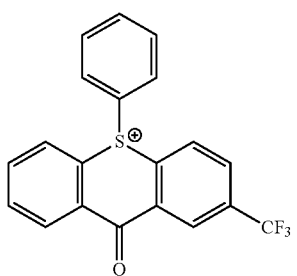
(ca-1-59)
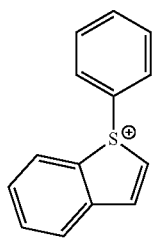
(ca-1-60)
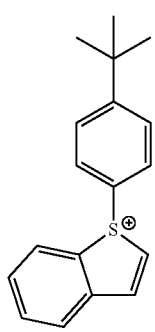
(ca-1-61)
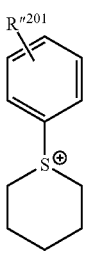
(ca-1-62)
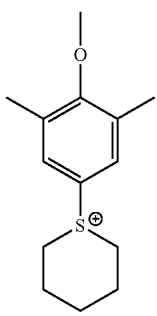
(ca-1-63)
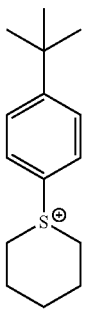
(ca-1-64)
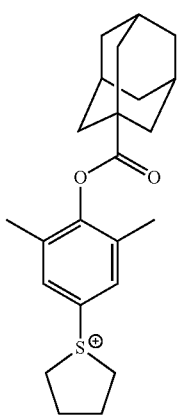

-continued (ca-1-65)

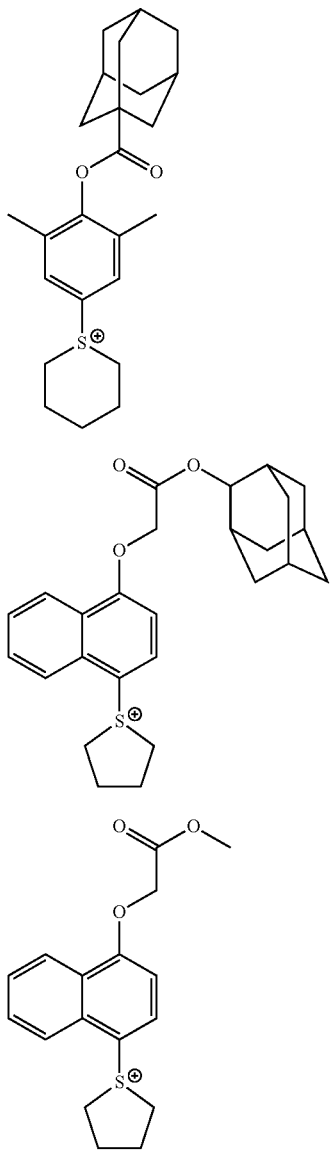

(ca-1-66)

(ca-1-67)

In the formulae, $R''^{201}$ represents a hydrogen atom or a substituent, and as the substituent, the same groups as those described above for substituting $R^{201}$ to $R^{207}$ and $R^{210}$ to $R^{212}$ can be mentioned.

Specific examples of preferable cations represented by the formula (ca-2) include a diphenyliodonium cation and a bis(4-tert-butylphenyl)iodonium cation.

Specific examples of preferable cations represented by formula (ca-3) include cations represented by formulae (ca-3-1) to (ca-3-6) shown below.

[Chemical Formula 25]

(ca-3-1)

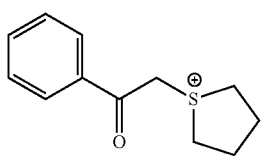

-continued (ca-3-2)

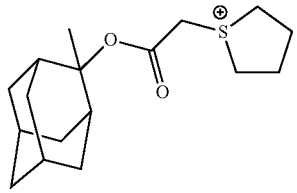

(ca-3-3)

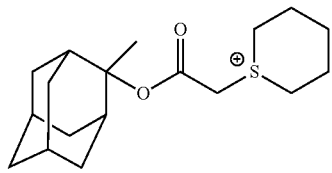

(ca-3-4)

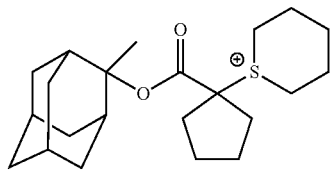

(ca-3-5)

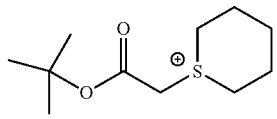

(ca-3-6)

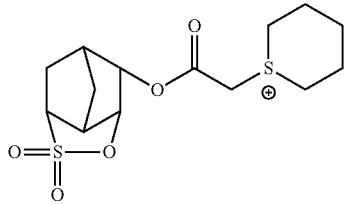

Specific examples of preferable cations represented by formula (ca-4) include cations represented by formulae (ca-4-1) and (ca-4-2) shown below.

[Chemical Formula 26]

(ca-4-1)

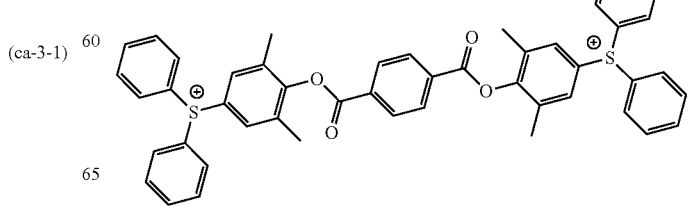

-continued (ca-4-2)

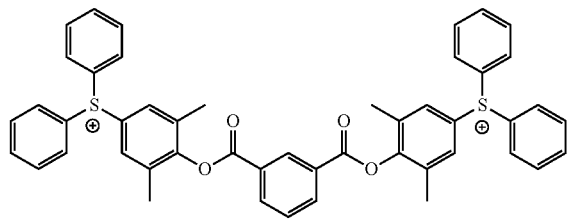

Among these examples, as the cation moiety, a cation represented by general formula (ca-1) is preferable, and a cation represented by any of formulae (ca-1-1) to (ca-1-67) is more preferable.

As the component (B), one type of these acid generators may be used alone, or two or more types may be used in combination.

When the resist composition contains the component (B), the amount of the component (B) relative to 100 parts by weight of the component (A) is preferably within a range from 0.5 to 60 parts by weight, more preferably from 1 to 50 parts by weight, and still more preferably from 1 to 40 parts by weight.

When the amount of the component (B) is within the above-mentioned range, pattern formation may be satisfactorily conducted. Further, by virtue of the above-mentioned range, when each of the components is dissolved in an organic solvent, a homogeneous solution may be more reliably obtained and the storage stability of the resist composition becomes satisfactory.

<<Other Components>>

The resist composition according to the present embodiment may contain, in addition to the aforementioned component (A) and (B), any other components. Examples of the other component include the component (D), the component (E), the component (F), and the component (S) shown below.

[Component (D): Acid Diffusion Control Agent]

The resist composition according to the present embodiment may include an acid diffusion control agent component (hereafter, sometimes referred to as "component (D)"), in addition to the component (A), or in addition to the component (A) and the component (B). The component (D) functions as an acid diffusion control agent, i.e., a quencher which traps the acid generated in the resist composition upon exposure.

The component (D) may be a photodecomposable base (D1) (hereafter, referred to as "component (D1)") which is decomposed upon exposure and then loses the ability of controlling of acid diffusion, or a nitrogen-containing organic compound (D2) (hereafter, referred to as "component (D2)") which does not fall under the definition of component (D1).

Component (D1)

When a resist pattern is formed using a resist composition containing the component (D1), the contrast between exposed portions and unexposed portions is improved.

The component (D1) is not particularly limited, as long as it is decomposed upon exposure and then loses the ability of controlling of acid diffusion. As the component (D1), at least one compound selected from the group consisting of a compound represented by general formula (d1-1) shown below (hereafter, referred to as "component (d1-1)"), a compound represented by general formula (d1-2) shown below (hereafter, referred to as "component (d1-2)") and a compound represented by general formula (d1-3) shown below (hereafter, referred to as "component (d1-3)") is preferably used.

At exposed portions of the resist film, the components (d1-1) to (d1-3) are decomposed and then lose the ability of controlling of acid diffusion (i.e., basicity), and therefore the components (d1-1) to (d1-3) cannot function as a quencher, whereas at unexposed portions, the components (d1-1) to (d1-3) functions as a quencher.

[Chemical Formula 27]

(d1-1)

(d1-2)

(d1-3)

In the formulae, $Rd^1$ to $Rd^4$ represent a cyclic group which may have a substituent, a chain-like alkyl group which may have a substituent or a chain-like alkenyl group which may have a substituent, provided that, the carbon atom adjacent to the sulfur atom within the $Rd^2$ in the formula (d1-2) has no fluorine atom bonded thereto; $Yd^1$ represents a single bond or a divalent linking group; m represents an integer of 1 or more; and each $M^{m+}$ independently represents an organic cation having a valency of m.

{Component (d1-1)}

Anion Moiety

In formula (d1-1), $Rd^1$ represents a cyclic group which may have a substituent, a chain-like alkyl group which may have a substituent or a chain-like alkenyl group which may have a substituent, and is the same groups as those defined above for Y in the aforementioned formula (3).

Among these, as the group for $Rd^1$, an aromatic hydrocarbon group which may have a substituent, an aliphatic cyclic group which may have a substituent and a chain-like alkyl group which may have a substituent are preferable. Examples of the substituent for these groups include a hydroxy group, an oxo group, an alkyl group, an aryl group, a fluorine atom, a fluorinated alkyl group, a lactone-containing cyclic group represented by any one of the aforementioned formulae (a2-r-1) to (a2-r-6), an ether bond, an ester bond, and a combination thereof. In the case where an ether bond or an ester bond is contained as a substituent, the substituent may be bonded through an alkylene group.

The aromatic hydrocarbon group is preferably a phenyl group or a naphthyl group.

Examples of the aliphatic cyclic group include groups in which one or more hydrogen atoms have been removed from a polycycloalkane such as adamantane, norbornane, isobornane, tricyclodecane or tetracyclododecane.

The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group or a 4-methylpentyl group.

In the case where the chain-like alkyl group is a fluorinated alkyl group having a fluorine atom or a fluorinated alkyl group, the fluorinated alkyl group preferably has 1 to 11 carbon atoms, more preferably 1 to 8 carbon atoms, and still more preferably 1 to 4 carbon atoms. The fluorinated alkyl group may contain an atom other than fluorine. Examples of the atom other than fluorine include an oxygen atom, a sulfur atom and a nitrogen atom.

As $Rd^1$, a fluorinated alkyl group in which part or all of the hydrogen atoms constituting a linear alkyl group have been substituted with fluorine atom(s) is preferable, and a fluorinated alkyl group in which all of the hydrogen atoms constituting a linear alkyl group have been substituted with fluorine atoms (i.e., a linear perfluoroalkyl group) is particularly desirable.

Specific examples of preferable anion moieties for the component (d1-1) are shown below.

[Chemical Formula 28]

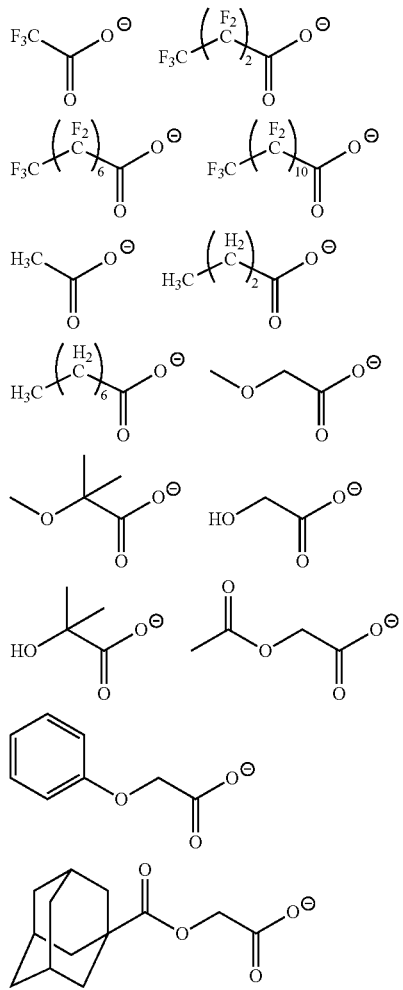

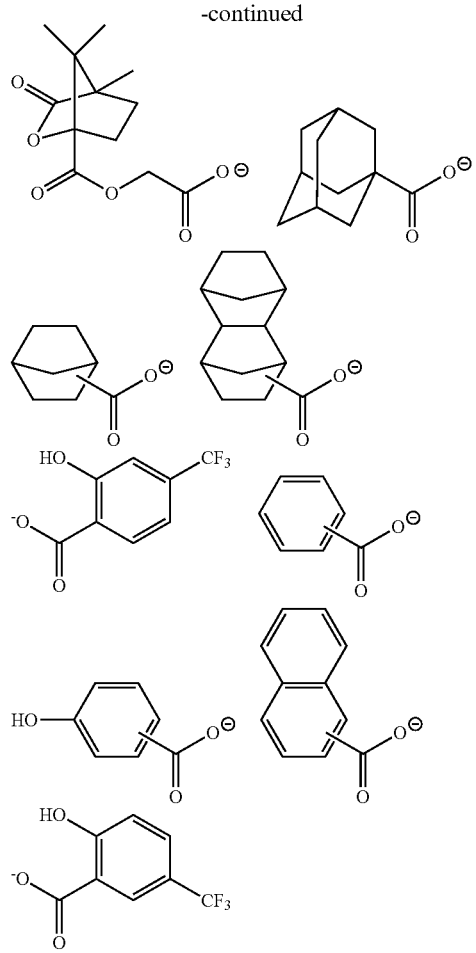

Cation Moiety

In formula (d1-1), $M^{m+}$ represents an organic cation having a valency of m.

As the organic cation for $M^{m+}$, for example, the same cation moieties as those represented by the aforementioned formulae (ca-1) to (ca-4) are preferable, cation moieties represented by the aforementioned general formulae (ca-1) is preferable, and cation moieties represented by the aforementioned formulae (ca-1-1) to (ca-1-67) are still more preferable.

As the component (d1-1), one type of compound may be used, or two or more types of compounds may be used in combination.

{Component (d1-2)}

Anion Moiety

In formula (d1-2), $Rd^2$ represents a cyclic group which may have a substituent, a chain-like alkyl group which may have a substituent or a chain-like alkenyl group which may have a substituent, and is the same groups as those defined above for Y in the aforementioned formula (3).

provided that, the carbon atom adjacent to the sulfur atom within $Rd^2$ group has no fluorine atom bonded thereto (i.e., the carbon atom adjacent to the sulfur atom within $Rd^2$ group does not substituted with a fluorine atom). As a result, the anion of the component (d1-2) becomes an appropriately weak acid anion, thereby improving the quenching ability of the component (D).

As $Rd^2$, a chain-like alkyl group which may have a substituent or an aliphatic cyclic group which may have a substituent is preferable. The chain-like alkyl group preferably has 1 to 10 carbon atoms, and more preferably 3 to 10 carbon atoms. As the aliphatic cyclic group, a group in which one or more hydrogen atoms have been removed from adamantane, norbornane, isobornane, tricyclodecane, tetracyclododecane or camphor (which may have a substituent) is more preferable.

The hydrocarbon group for $Rd^2$ may have a substituent. As the substituent, the same groups as those described above for substituting the hydrocarbon group (e.g., aromatic hydrocarbon group, aliphatic cyclic group, chain-like alkyl group) for Rd' in the formula (d1-1) can be mentioned.

Specific examples of preferable anion moieties for the component (d1-2) are shown below.

[Chemical Formula 29]

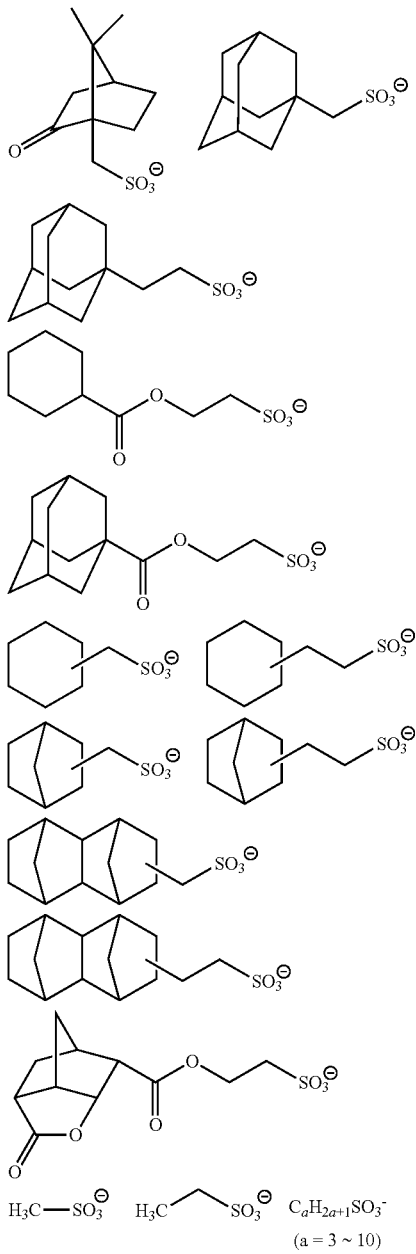

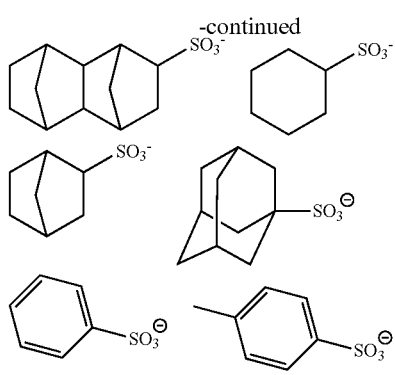

Cation Moiety

In formula (d1-2), $M^{m+}$ is an organic cation having a valency of m, and is the same as defined for $M^{m+}$ in the aforementioned formula (d1-1).

As the component (d1-2), one type of compound may be used, or two or more types of compounds may be used in combination.

{Component (d1-3)}

Anion Moiety

In formula (d1-3), $Rd^3$ represents a cyclic group which may have a substituent, a chain-like alkyl group which may have a substituent or a chain-like alkenyl group which may have a substituent, and is the same groups as those defined above for Y in the aforementioned formula (3), and a cyclic group containing a fluorine atom, a chain-like alkyl group or a chain-like alkenyl group is preferable. Among these, a fluorinated alkyl group is preferable, and more preferably the same fluorinated alkyl groups as those described above for $Rd^1$.

In formula (d1-3), $Rd^4$ represents a cyclic group which may have a substituent, a chain-like alkyl group which may have a substituent or a chain-like alkenyl group which may have a substituent, and is the same groups as those defined above for Y in the aforementioned formula (3).

Among these, an alkyl group which may have substituent, an alkoxy group which may have substituent, an alkenyl group which may have substituent or a cyclic group which may have substituent is preferable.

The alkyl group for $Rd^4$ is preferably a linear or branched alkyl group of 1 to 5 carbon atoms, and specific examples include a methyl group, an ethyl group, an n-propyl group, an isopropyl group, an n-butyl group, an isobutyl group, a tert-butyl group, a pentyl group, an isopentyl group, and a neopentyl group. Part of the hydrogen atoms within the alkyl group for $Rd^4$ may be substituted with a hydroxy group, a cyano group or the like.

The alkoxy group for $Rd^4$ is preferably an alkoxy group of 1 to 5 carbon atoms, and specific examples thereof include a methoxy group, an ethoxy group, an n-propoxy group, an iso-propoxy group, an n-butoxy group and a tert-butoxy group. Among these, a methoxy group and an ethoxy group are preferable.

As the alkenyl group for $Rd^4$, the same groups as those described above for Y in the aforementioned formula (3) may be mentioned, and a vinyl group, a propenyl group (an allyl group), a 1-methylpropenyl group and a 2-methylpropenyl group are preferable. These groups may have an alkyl group of 1 to 5 carbon atoms or a halogenated alkyl group of 1 to 5 carbon atoms as a substituent.

As the cyclic group for $Rd^4$, the same groups as those described above for Y in the aforementioned formula (3)

may be mentioned. Among these, as the cyclic group, an alicyclic group (e.g., a group in which one or more hydrogen atoms have been removed from a cycloalkane such as cyclopentane, cyclohexane, adamantane, norbornane, isobornane, tricyclodecane or tetracyclododecane) or an aromatic group (e.g., a phenyl group or a naphthyl group) is preferable. In the case where Rd[4] is an alicyclic group, the resist composition may be satisfactorily dissolved in an organic solvent, such that the lithography properties are improved. Further, in the case where Rd[4] is an aromatic group, in lithography process using EUV or the like as the exposure source, the light absorption efficiency of the resist composition is improved, and the sensitivity and the lithography properties become satisfactory.

In formula (d1-3), $Yd^1$ represents a single bond or a divalent linking group. The divalent linking group for $Yd^1$ is not particularly limited, and examples thereof include a divalent hydrocarbon group (aliphatic hydrocarbon group, or aromatic hydrocarbon group) which may have a substituent and a divalent linking group containing a hetero atom.

As $Yd^1$, a carbonyl group, an ester bond, an amide bond, an alkylene group or a combination of these is preferable. As the alkylene group, a linear or branched alkylene group is more preferable, and a methylene group or an ethylene group is still more preferable.

Specific examples of preferable anion moieties for the component (d1-3) are shown below.

[Chemical Formula 30]

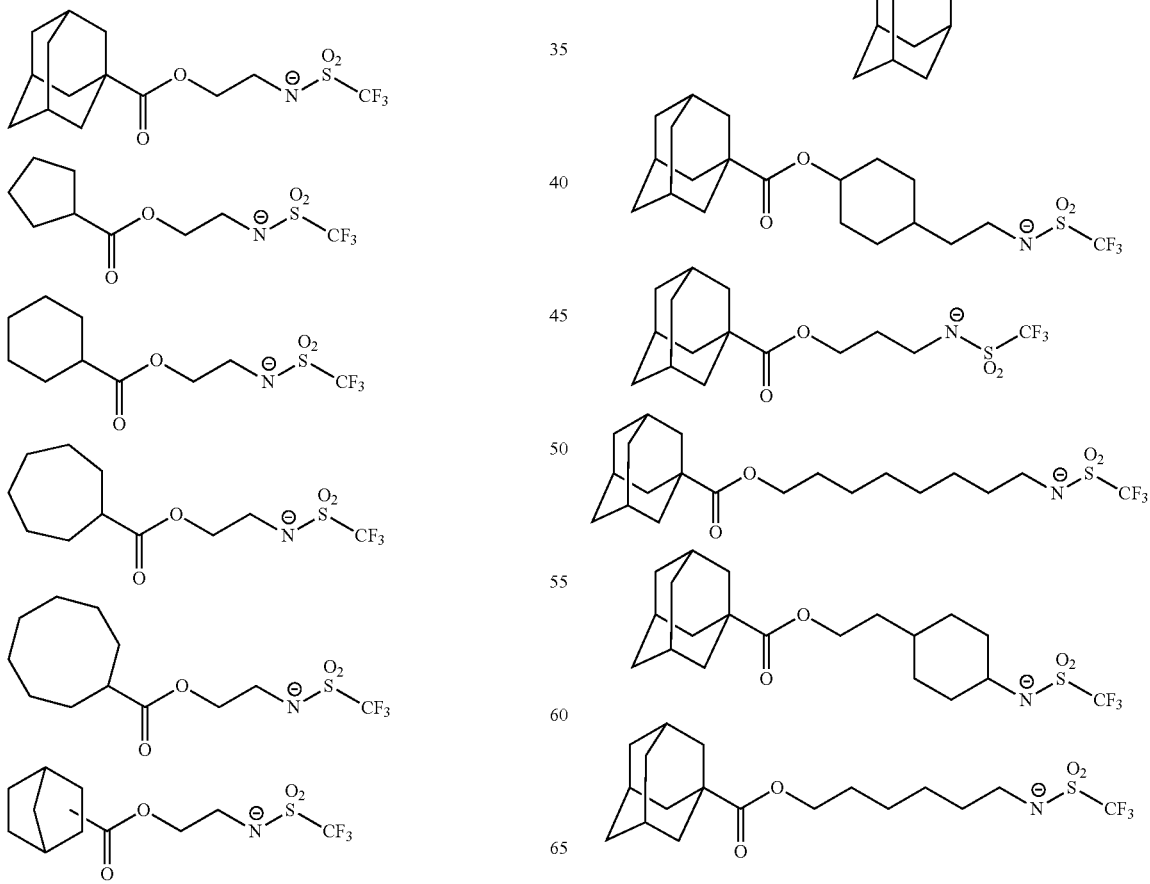

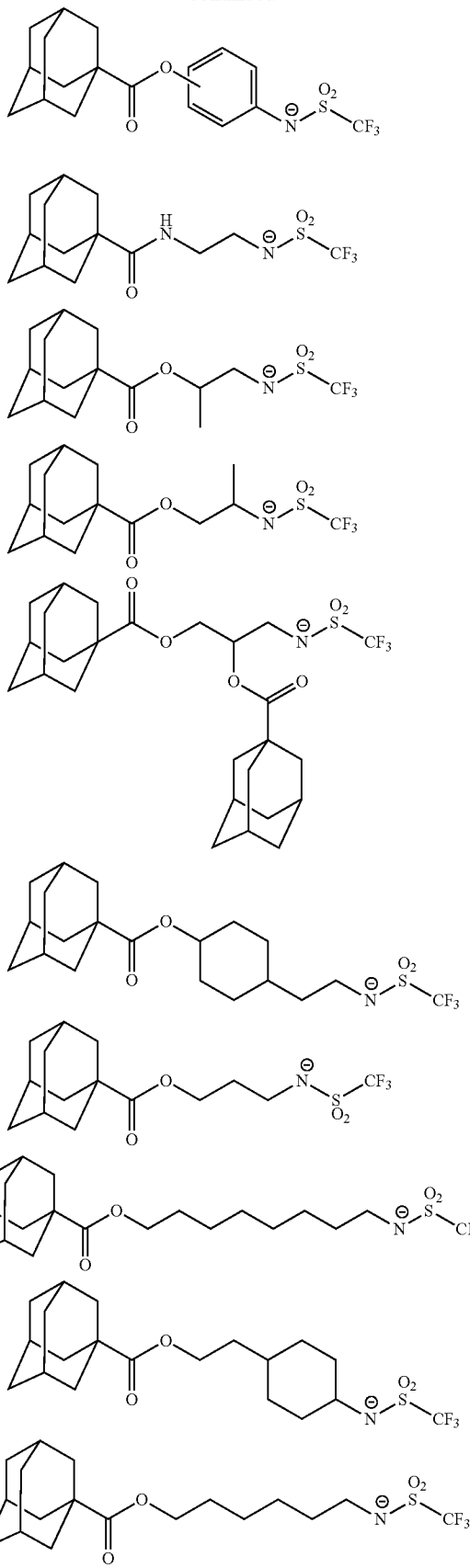

-continued

[Chemical Formula 31]

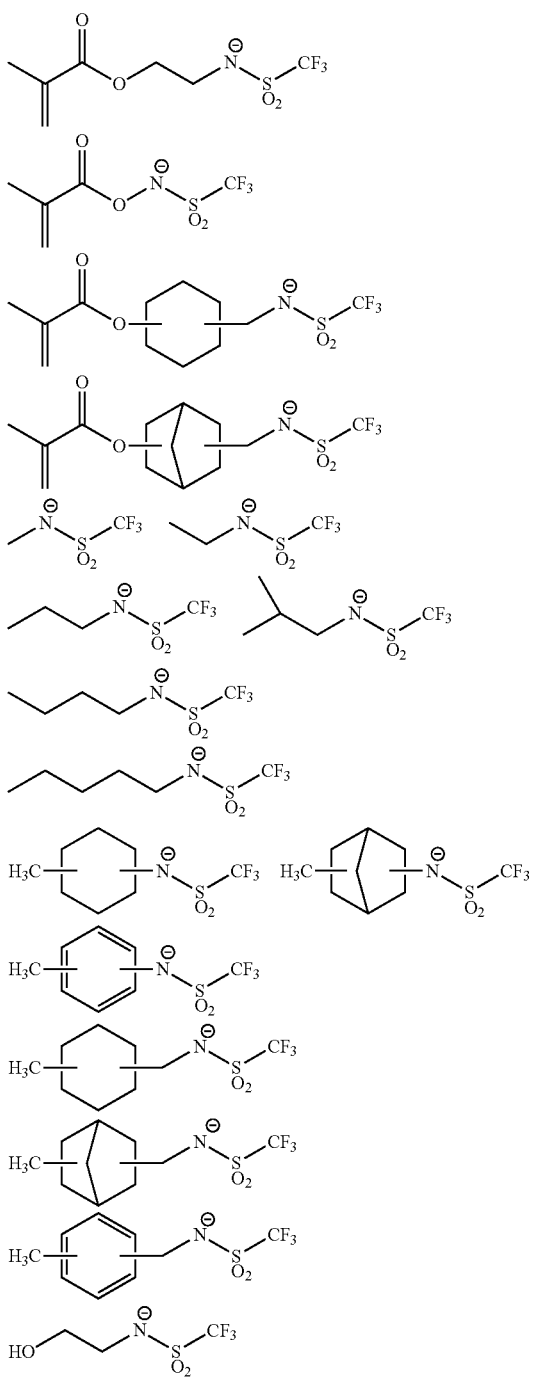

Cation Moiety

In formula (d1-3), $M^{m+}$ is an organic cation having a valency of m, and is the same as defined for $M^{m+}$ in the aforementioned formula (d1-1).

As the component (d1-3), one type of compound may be used, or two or more types of compounds may be used in combination.

As the component (D1), one type of the aforementioned components (d1-1) to (d1-3), or at least two types of the aforementioned components (d1-1) to (d1-3) can be used in combination.

Among these examples, as the component (D1), it is preferable to us at least the component (d1-1).

When the resist composition contains the component (D1), the amount of the component (D1) relative to 100 parts by weight of the component (A) is preferably within a range from 0.5 to 10 parts by weight, more preferably from 0.5 to 8 parts by weight, and still more preferably from 1 to 8 parts by weight.

When the amount of the component (D1) is at least as large as the lower limit of the above-mentioned range, excellent lithography properties and excellent resist pattern shape can be more reliably obtained. On the other hand, when the amount of the component (D1) is no more than the upper limit of the above-mentioned range, sensitivity can be maintained at a satisfactory level, and through-put becomes excellent.

Production Method of Component (D1):

The production methods of the components (d1-1) and (d1-2) are not particularly limited, and the components (d1-1) and (d1-2) can be produced by conventional methods.

Further, the production method of the component (d1-3) is not particularly limited, and the component (d1-3) can be produced in the same manner as disclosed in US2012-0149916.

Component (D2)

The acid diffusion control component may contain a nitrogen-containing organic compound (D2) (hereafter, referred to as component (D2)) which does not fall under the definition of component (D1).

The component (D2) is not particularly limited, as long as it functions as an acid diffusion control agent, and does not fall under the definition of the component (D1). As the component (D2), any of the conventionally known compounds may be selected for use. Among these, an aliphatic amine is preferable, and a secondary aliphatic amine or tertiary aliphatic amine is more preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine)

Specific examples of the aliphatic monocyclic amine include piperidine, and piperazine.

The aliphatic polycyclic amine preferably has 6 to 10 carbon atoms, and specific examples thereof include 1, 5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine and triethanolamine triacetate, and triethanolamine triacetate is preferable.

Further, as the component (D2), an aromatic amine may be used.

Examples of aromatic amines include 4-dimethylaminopyridine, pyrrole, indole, pyrazole, imidazole and derivatives thereof, as well as tribenzylamine, 2,6-diisopropylaniline and N-tert-butoxycarbonylpyrrolidine.

As the component (D2), one kind of compound may be used, or two or more kinds of compounds may be used in combination.

When the resist composition contains the component (D2), the amount of the component (D2) is typically used in an amount within a range from 0.01 to 5 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

[Component (E): At Least One Compound Selected from the Group Consisting of Organic Carboxylic Acids, and Phosphorus Oxo Acids and Derivatives Thereof]

In the resist composition of the present embodiment, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof may be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable. Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters and phenylphosphinic acid.

As the component (E), one type may be used alone, or two or more types may be used in combination.

When the resist composition contains the component (E), the amount of the component (E) is typically used in an amount within a range from 0.01 to 5 parts by weight, relative to 100 parts by weight of the component (A).

[Component (F): Fluorine Additive]

In the present embodiment, the resist composition may further include a fluorine additive (hereafter, sometimes referred to as "component (F)") for imparting water repellency to the resist film.

As the component (F), for example, a fluorine-containing polymeric compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be used. Specific examples of the component (F) include polymers having a structural unit (f1) represented by general formula (f1-1) shown below. However, polymeric compounds which fall under the definition of the aforementioned component (A) are excluded.

As the polymer having a structural unit (f1), a polymer (homopolymer) consisting of a structural unit (f1); a copolymer of a structural unit (f1) and a structural unit represented by general formula (m-1) shown below; and a copolymer of a structural unit (f1), a structural unit derived from acrylic acid or methacrylic acid, and a structural unit represented by general formula (m-1) shown below.

As the structural unit represented by general formula (m-1), a structural unit derived from 1-ethyl-1cyclooctyl (meth)acrylate or a structural unit derived from 1-methyl-1-adamantyl (meth)acrylate is preferable.

[Chemical Formula 32]

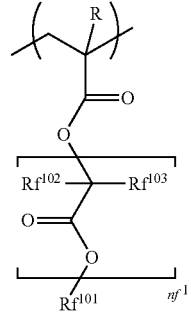

(f1-1)

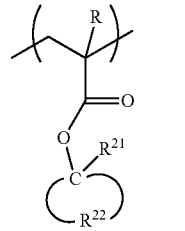

(m-1)

In the formulae, each R independently represents a hydrogen atom, an alkyl group of 1 to 5 carbon atoms or a halogenated alkyl group of 1 to 5 carbon atoms; in formula (f1-1), $Rf^{102}$ and $Rf^{103}$ each independently represents a hydrogen atom, a halogen atom, an alkyl group of 1 to 5 carbon atoms or a halogenated alkyl group of 1 to 5 carbon atoms, provided that $Rf^{102}$ and $Rf^{103}$ may be the same or different; $nf^1$ represents an integer of 0 to 5; $Rf^{101}$ represents an organic group containing a fluorine atom; in formula (m-1), $R^{21}$ represents an alkyl group; $R^{22}$ is a group which forms an aliphatic cyclic group together with a carbon atom having $R^{22}$ bonded thereto;

In formula (f1-1), R represents a hydrogen atom, an alkyl group of 1 to 5 carbon atoms or a halogenated alkyl group of 1 to 5 carbon atoms. In formula (f1-1), R is the same as defined for R in the aforementioned formula (1).

As R, a hydrogen atom, an alkyl group of 1 to 5 carbon atoms or a fluorinated alkyl group of 1 to 5 carbon atoms is preferable, and in terms of industrial availability, a hydrogen atom or an alkyl group of 1 to 5 carbon atoms is more preferable, an alkyl group of 1 to 5 carbon atoms is still more preferable, and a methyl group is still most preferable.

In formula (f1-1), examples of the halogen atom for $Rf^{102}$ and $Rf^{103}$ include a fluorine atom, a chlorine atom, a bromine atom and an iodine atom, and a fluorine atom is particularly desirable. Examples of the alkyl group of 1 to 5 carbon atoms for $Rf^{102}$ and $Rf^{103}$ include the same alkyl group of 1 to 5 carbon atoms as those described above for R, and a methyl group or an ethyl group is preferable. Specific examples of the halogenated alkyl group of 1 to 5 carbon atoms represented by $Rf^{102}$ or $Rf^{103}$ include groups in which part or all of the hydrogen atoms of the aforementioned alkyl groups of 1 to 5 carbon atoms have been substituted with halogen atoms.

Examples of the halogen atom include a fluorine atom, a chlorine atom, a bromine atom and an iodine atom, and a fluorine atom is particularly desirable. Among these examples, as $Rf^{102}$ and $Rf^{103}$, a hydrogen atom, a fluorine atom or an alkyl group of 1 to 5 carbon atoms is preferable, and a hydrogen atom, a fluorine atom, a methyl group or an ethyl group is more preferable.

In formula (f1-1), $nf^1$ represents an integer of 0 to 5, preferably an integer of 0 to 3, and more preferably 0 or 1.

In formula (f1-1), $Rf^{101}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and most preferably 1 to 10 carbon atoms.

It is preferable that the hydrocarbon group having a fluorine atom has 25% or more of the hydrogen atoms within the hydrocarbon group fluorinated, more preferably 50% or more, and most preferably 60% or more, as the hydrophobicity of the resist film during immersion exposure is enhanced.

Among these, as $Rf^{101}$, a fluorinated hydrocarbon group of 1 to 5 carbon atoms is preferable, and a trifluoromethyl group, —$CH_2$—$CF_3$, —$CH_2$—$CF_2$—$CF_3$, —$CH(CF_3)_2$, —$CH_2$—$CH_2$—$CF_3$, and —$CH_2$—$CH_2$—$CF_2$—$CF_2$—$CF_2$—$CF_3$ are most preferable.

In formula (m-1), the alkyl group for $R^{21}$ may be linear, branched or cyclic, and is preferably linear or branched. The linear alkyl group preferably has 1 to 5 carbon atoms, more preferably 1 to 4, and still more preferably 1 or 2. Specific examples include a methyl group, an ethyl group, an n-propyl group, an n-butyl group, and an n-pentyl group. Among these examples, a methyl group, an ethyl group or an n-butyl group is preferable, and a methyl group or an ethyl group is more preferable. The branched alkyl group preferably has 3 to 10 carbon atoms, and more preferably 3 to 5. Specific examples of such branched alkyl groups include an isopropyl group, an isobutyl group, a tert-butyl group, an isopentyl group and a neopentyl group, and an isopropyl group is particularly desirable.

In formula (m-1), $R^{22}$ is a group which forms an aliphatic cyclic group together with a carbon atom having $R^{22}$ bonded thereto. The aliphatic cyclic group formed by $R^{22}$ may be polycyclic or monocyclic. As the monocyclic aliphatic hydrocarbon group, a group in which one or more hydrogen atoms have been removed from a monocycloalkane is preferable. The monocycloalkane preferably has 3 to 10 carbon atoms, and examples thereof include cyclopentane, cyclohexane and cyclooctane. As the polycyclic aliphatic hydrocarbon group, a group in which one or more hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (F) is preferably 1.0 to 5.0, more preferably 1.0 to 3.0, and most preferably 1.2 to 2.5.

As the component (F), one type may be used alone, or two or more types may be used in combination.

When the resist composition contains the component (F), the component (F) is used in an amount within a range from 0.5 to 10 parts by weight, relative to 100 parts by weight of the component (A).

If desired, other miscible additives can also be added to the resist composition of the present embodiment. Examples of such miscible additives include additive resins for improving the performance of the resist film, dissolution inhibitors, plasticizers, stabilizers, colorants, halation prevention agents, and dyes.

[Component (S): Organic Solvent]

The resist composition of the present embodiment may be prepared by dissolving the resist materials for the resist composition in an organic solvent (hereafter, sometimes referred to as "component (S)").

The component (S) may be any organic solvent which can dissolve the respective components to give a homogeneous solution, and any organic solvent can be appropriately selected from those which have been conventionally known as solvents for a chemically amplified resist composition.

Examples thereof include lactones such as α-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

As the component (S), 1 kind of solvent may be used, or 2 or more solvents may be used as a mixed solvent.

Among these, PGMEA, PGME, γ-butyrolactone, EL (ethyl lactate) and cyclohexanone are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL or cyclohexanone is mixed as the polar solvent, the PGMEA:EL or cyclohexanone weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3. Furthermore, a mixed solvent of PGMEA, PGME and cyclohexanone is also preferable.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate. In general, the component (S) is used in an amount such that the solid content of the resist composition becomes within the range from 1 to 20% by weight, and preferably from 2 to 15% by weight.

In a method of forming a resist pattern using the resist composition according to the present embodiment described above, the effect can be obtained in terms of forming a fine pattern with a satisfactory shape. As a fine pattern, a resist pattern having a size of 50 nm or less is formed. For example, a fine line and space pattern may be formed without pattern collapse. Further, a fine trench pattern may be formed with high resolution.

In the case of forming a fine pattern having a size of 50 nm on a substrate, during exposure, the strength of the light irradiated on the resist film becomes non-uniform at exposed portions and unexposed portions.

Further, particularly at exposed portions of the resist film in the film thickness direction, regions where optical strength is weak are generated.

In contrast, in the method of forming a resist pattern according to the present invention, a resist pattern containing a polymeric compound having structural units (a-1) and (a-2) is used, wherein the acid decomposable group requires relatively low activation energy as compared to other acid decomposable groups when at least a part of the bond in the structure of the acid decomposable group is cleaved by the action of acid. By virtue of employing a polymeric compound having 2 kinds of specific structural units, in the formation of a resist pattern, diffusion of acid to unexposed portions of the resist film may be suppressed. In addition, reactions may uniformly occur by acid, exposure or heating within the resist film. In the method forming a resist pattern according to the present invention, by applying a negative-tone developing process using an organic developing solution, regions where the optical strength are weak are selectively dissolved and removed.

Further, in a method of forming a resist pattern using the resist composition of the present embodiment described above, by virtue of employing the component (A) as the resin component of the resist composition and the component (B) as the acid generator, EL is improved, and deviation of maximum/minimum CD is reduced in the formation of contact hole (CH).

<<Method of Forming a Resist Pattern>>

The method of forming a resist pattern according to a second aspect of the present invention includes a step of forming a resist film using the resist composition of the first aspect; a step of exposing the resist film; and a step of developing the resist film to form a resist pattern.

More specifically, the method of forming a resist pattern includes a step of forming a resist film on a substrate using a resist composition which generates acid upon exposure and exhibits changed solubility in a developing solution by the action of acid; a step of exposing the resist film; and a step of patterning the exposed resist film by development using a developing solution to form a resist pattern.

The method for forming a resist pattern may be performed, for example, as follows.

Firstly, a resist composition which generates acid upon exposure and exhibits changed solubility in a developing solution by the action of acid is applied to a substrate using a spinner or the like, and a bake treatment (post applied bake (PAB)) is conducted at a temperature of 80 to 150° C. for 40 to 120 seconds, preferably 60 to 90 seconds, to form a resist film.

As the resist composition, the aforementioned resist composition is used.

Following selective exposure of the thus formed resist film, either by exposure through a photomask having a predetermined pattern formed thereon (mask pattern) using an exposure apparatus such an ArF exposure apparatus, an electron beam lithography apparatus or an EUV exposure apparatus, or by patterning via direct irradiation with an electron beam without using a photomask.

Then, baking treatment (post exposure baking (PEB)) is conducted under temperature conditions of 80 to 150° C. for 40 to 120 seconds, and preferably 60 to 90 seconds.

Next, the resist film after the exposure and baking (PEB) is subjected to a developing treatment.

The developing treatment is conducted using an alkali developing solution in the case of an alkali developing process, and a developing solution containing an organic solvent (organic developing solution) in the case of a solvent developing process.

After the developing treatment, it is preferable to conduct a rinse treatment. The rinse treatment is preferably conducted using pure water in the case of an alkali developing process, and a rinse solution containing an organic solvent in the case of a solvent developing process.

In the case of a solvent developing process, after the developing treatment or the rinsing, the developing solution or the rinse liquid remaining on the pattern can be removed by a treatment using a supercritical fluid.

After the developing treatment or the rinse treatment, drying is conducted. If desired, bake treatment (post bake) can be conducted following the developing. In this manner, a resist pattern can be obtained.

By conducting the above operations, a fine resist pattern can be formed.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The method of forming a resist pattern according to the present embodiment is effective to KrF excimer laser, ArF excimer laser, EB and EUV, and more effective to ArF excimer laser, EB and EUV, and most effective to EB and EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

In an alkali developing process, as the alkali developing solution used in the developing treatment, any conventional alkali developing may be appropriately selected which is capable of dissolving the aforementioned component (A) (component (A) prior to exposure). As an example of the alkali developing solution used in an alkali developing process, a 0.1 to 10% by weight aqueous solution of tetramethylammonium hydroxide (TMAH) may be given.

In a solvent developing process, as the organic solvent contained in the organic developing solution used in the developing treatment, any conventional organic solvent may be appropriately selected which is capable of dissolving the aforementioned component (A) (component (A) prior to exposure). Specific examples of the organic solvent include polar solvents such as ketone solvents, ester solvents, alcohol solvents, nitrile solvents, amide solvents and ether solvents, and hydrocarbon solvents. The developing solution may contain 80% by weight or more of an organic solvent.

A ketone solvent is an organic solvent containing C—C(=O)—C within the structure thereof. An ester solvent is an organic solvent containing C—C(=O)—O—C within the structure thereof. An alcohol solvent is an organic solvent containing an alcoholic hydroxy group in the structure thereof. An "alcoholic hydroxy group" refers to a hydroxy group bonded to a carbon atom of an aliphatic hydrocarbon group. A nitrile solvent is an organic solvent containing a nitrile group in the structure thereof. An amide solvent is an organic solvent containing an amide group within the structure thereof. An ether solvent is an organic solvent containing C—O—C within the structure thereof.

Some organic solvents have a plurality of the functional groups which characterizes the aforementioned solvents within the structure thereof. In such a case, the organic solvent can be classified as any type of the solvent having the characteristic functional group. For example, diethyleneglycol monomethylether can be classified as either an alcohol solvent or an ether solvent.

A hydrocarbon solvent consists of a hydrocarbon which may be halogenated, and does not have any substituent other than a halogen atom. Examples of the halogen atom include a fluorine atom, a chlorine atom, a bromine atom and an iodine atom, and a fluorine atom is preferable.

As the developing solution used in a solvent developing process, in terms of more reliably obtaining a resist pattern with high resolution, it is preferable to contain at least one member selected from the group consisting of an ester organic solvent and a ketone organic solvent, and it is more preferable to contain an ester organic solvent.

Examples of ester organic solvents include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate and propyl-3-methoxypropionate.

Among these examples, as an ester solvent, butyl acetate is preferable.

Examples of ketone organic solvents include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, propylenecarbonate, γ-butyrolactone and methyl amyl ketone (2-heptanone).

Among these examples, as a ketone organic solvent, methyl amyl ketone (2-heptanone) is preferable.

If desired, the organic developing solution may have a conventional additive blended. Examples of the additive include surfactants. The surfactant is not particularly limited, and for example, an ionic or non-ionic fluorine and/or silicon surfactant may be used.

As the surfactant, a non-ionic surfactant is preferable, and a fluorine surfactant or a silicon surfactant is more preferable.

When a surfactant is added to the organic developing solution, the amount thereof based on the total amount of the organic developing solution is generally 0.001 to 5% by weight, preferably 0.005 to 2% by weight, and more preferably 0.01 to 0.5% by weight.

The developing treatment can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

As the organic solvent contained in the rinse liquid used in the rinse treatment after the developing in the case of a solvent developing process, any of the aforementioned organic solvents contained in the organic developing solution can be used which hardly dissolves the resist pattern. In general, at least one solvent selected from the group consisting of hydrocarbon organic solvents, ketone organic solvents, ester organic solvents, alcohol organic solvents, amide organic solvents and ether organic solvents is used. Among these, at least one solvent selected from the group consisting of hydrocarbon organic solvents, ketone organic solvents, ester organic solvents, alcohol organic solvents and amide organic solvents is preferable, more preferably at least one solvent selected from the group consisting of ester organic solvents and ketone organic solvents, and most preferably ester organic solvents.

These organic solvents can be used individually, or at least 2 solvents may be mixed together. Further, an organic solvent other than the aforementioned examples or water may be mixed together. However, in consideration of the development characteristics, the amount of water within the rinse liquid, based on the total amount of the rinse liquid is preferably 30% by weight or less, more preferably 10% by weight or less, still more preferably 5% by weight or less, and most preferably 3% by weight or less.

If desired, the rinse solution may have a conventional additive blended. Examples of the additive include surfactants. As the surfactant, the same surfactants as those described above can be mentioned, and a non-ionic surfactant is preferable, and a fluorine surfactant or a silicon surfactant is more preferable.

When a surfactant is added, the amount thereof based on the total amount of the rinse liquid is generally 0.001 to 5% by weight, preferably 0.005 to 2% by weight, and more preferably 0.01 to 0.5% by weight.

The rinse treatment using a rinse liquid (washing treatment) may be conducted by a conventional rinse method. Examples of the rinse method include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

EXAMPLES

As follows is a description of examples of the present invention, although the scope of the present invention is by no way limited by these examples.

<Base Component of Resist Composition: Polymeric Compound>

The base components P-1 to P-14 used in the present examples were obtained by radical polymerization of monomers M-1 to M-10 which provides the structural units that constitute each polymeric compound with a predetermined ratio.

[Chemical Formula 33]
M-1 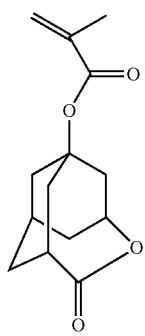
M-2 
M-3 
M-4 
M-5 
M-6 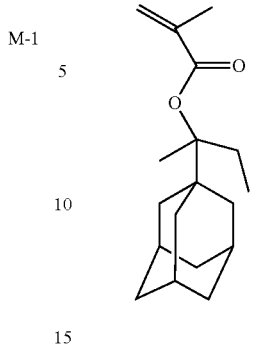
M-7 
M-8 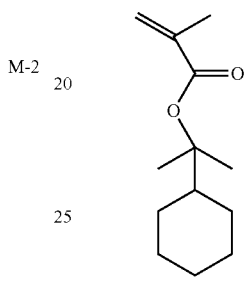
M-9 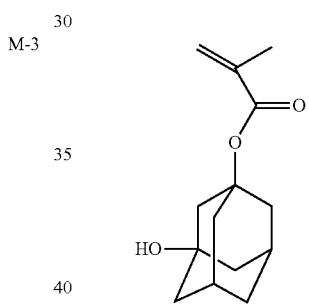
M-10 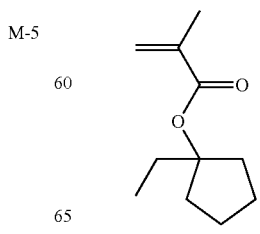

With respect to the polymeric compounds P-1 to P-14, the compositional ratio of the polymers (the molar ratio of the respective structural units in the polymeric compound) as determined by $^{13}$C-NMR, the weight average molecular weight (Mw) and the polydispersity (PDI) determined by the polystyrene equivalent value as measured by GPC are also shown in Table 1.

TABLE 1

| Poly-mer | Monomer | | | | Molar ratio | Mw | PDI |
|---|---|---|---|---|---|---|---|
| | (a-1) | (a-2) | Others | | | | |
| P-1 | M-1 | M-5 | — | — | 50/50 | 8900 | 1.71 |
| P-2 | M-1 | M-5 | M-2 | — | 20/50/30 | 8100 | 1.72 |
| P-3 | M-1 | M-5 | — | M-8 | 50/40/10 | 7000 | 1.69 |
| P-4 | — | M-5 | M-3 | — | 50/50 | 7800 | 1.73 |
| P-5 | — | M-5 | M-4 | — | 50/50 | 6700 | 1.68 |
| P-6 | — | — | M-2 | M-7 M-8 | 40/50/10 | 8900 | 1.77 |
| P-7 | M-1 | M-5 | — | — | 55/45 | 9100 | 1.85 |
| P-8 | M-1 | — | — | M-10 | 55/45 | 8700 | 1.77 |
| P-9 | — | M-5 | M-2 | — | 45/55 | 8700 | 1.9 |
| P-10 | M-9 | M-5 | — | — | 50/50 | 8900 | 1.68 |
| P-11 | M-9 | M-5 | M-2 | — | 20/50/30 | 9100 | 1.66 |
| P-12 | M-1 | M-5 | M-2 | M-6 M-8 | 20/20/20/30/10 | 8700 | 1.61 |
| P-13 | — | M-5 | M-2 | — | 50/50 | 8900 | 1.69 |
| P-14 | — | M-5 | M-2 | M-6 M-8 | 20/40/30/10 | 9100 | 1.67 |

<Resist Composition>

The components shown in Table 2 were mixed together and dissolved to obtain each resist composition to be used in each example of the formation of a resist pattern.

In Table 2, the reference characters indicate the following. The values in brackets [ ] indicate the amount (in terms of parts by weight) of the component added.

(A) P-1 to P-14: Polymeric Compounds P-1 to P-14 in Table 1

(B) PAG-1 and PAG-4: Acid Generators Represented by Following Chemical Formulae

[Chemical Formula 34]

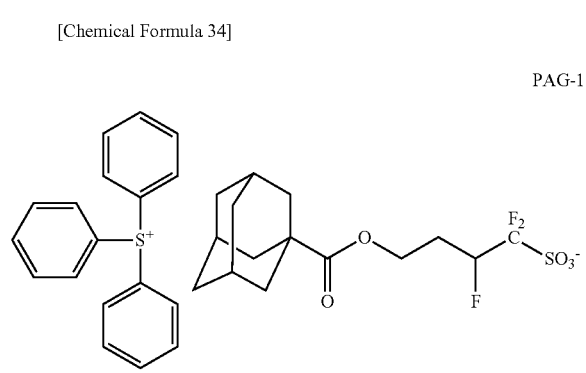

PAG-1

TABLE 2

| | Component (A) | Component (B) | | Component (D) | Component (F) | Component (S) |
|---|---|---|---|---|---|---|
| Example 1 | P-1 [100] | PAG-1 [5.6] | — | Q-1 [4.1] | F-1 [2] | PGMEA/PGME [2000/800] |
| Example 2 | P-2 [100] | PAG-1 [5.6] | — | Q-1 [4.1] | F-1 [2] | PGMEA/PGME [2000/800] |
| Example 3 | P-3 [100] | PAG-1 [5.6] | — | Q-1 [4.1] | F-1 [2] | PGMEA/PGME [2000/800] |
| Example 4 | P-1 [100] | PAG-2 [7] | — | Q-2 [3.5] | F-1 [2] | PGMEA/PGME [2000/800] |
| Example 5 | P-2 [100] | PAG-2 [8] | — | Q-2 [4] | F-1 [2] | PGMEA/PGME [2000/800] |
| Comparative Example 1 | P-4 [100] | PAG-1 [5.6] | — | Q-1 [4.1] | F-1 [2] | PGMEA/PGME [2000/800] |
| Comparative Example 2 | P-5 [100] | PAG-1 [5.6] | — | Q-1 [4.1] | F-1 [2] | PGMEA/PGME [2000/800] |
| Comparative Example 3 | P-6 [100] | PAG-1 [5.6] | — | Q-1 [4.1] | F-1 [2] | PGMEA/PGME [2000/800] |
| Comparative Example 4 | P-1 [100] | PAG-3 [5.4] | — | Q-1 [4.1] | F-1 [2] | PGMEA/PGME [2000/800] |
| Comparative Example 5 | P-7 [100] | PAG-3 [5.6] | — | Q-1 [4.1] | F-1 [2] | PGMEA/PGME [2000/800] |
| Comparative Example 6 | P-8 [100] | PAG-1 [5.6] | — | Q-1 [4.1] | F-1 [2] | PGMEA/PGME [2000/800] |
| Comparative Example 7 | P-9 [100] | PAG-1 [5.6] | — | Q-1 [4.1] | F-1 [2] | PGMEA/PGME [2000/800] |
| Example 6 | P-10 [100] | PAG-2 [9] | PAG-4 [5] | Q-2 [3] | F-1 [2] | PGMEA/PGME [2050/880] |
| Example 7 | P-1 [100] | PAG-2 [9] | PAG-4 [5] | Q-2 [3] | F-1 [2] | PGMEA/PGME [2050/880] |
| Example 8 | P-11 [100] | PAG-2 [9] | PAG-4 [5] | Q-2 [3] | F-1 [2] | PGMEA/PGME [2050/880] |
| Example 9 | P-2 [100] | PAG-2 [9] | PAG-4 [5] | Q-2 [3] | F-1 [2] | PGMEA/PGM [2050/880] |
| Example 10 | P-12 [100] | PAG-2 [9] | PAG-4 [5] | Q-2 [3] | F-1 [2] | PGMEA/PGME [2050/880] |
| Comparative Example 8 | P-13 [100] | PAG-2 [9] | PAG-4 [5] | Q-2 [3] | F-1 [2] | PGMEA/PGME [2050/880] |
| Comparative Example 9 | P-14 [100] | PAG-2 [9] | PAG-4 [5] | Q-2 [3] | F-1 [2] | PGMEA/PGME [2050/880] |

-continued

PAG-2

PAG-3

PAG-4

Component (D) Q-1 and Q-2: Acid Diffusion Control Agents Represented by Following Chemical Formulae

[Chemical Formula 35]

Q-1

Q-2

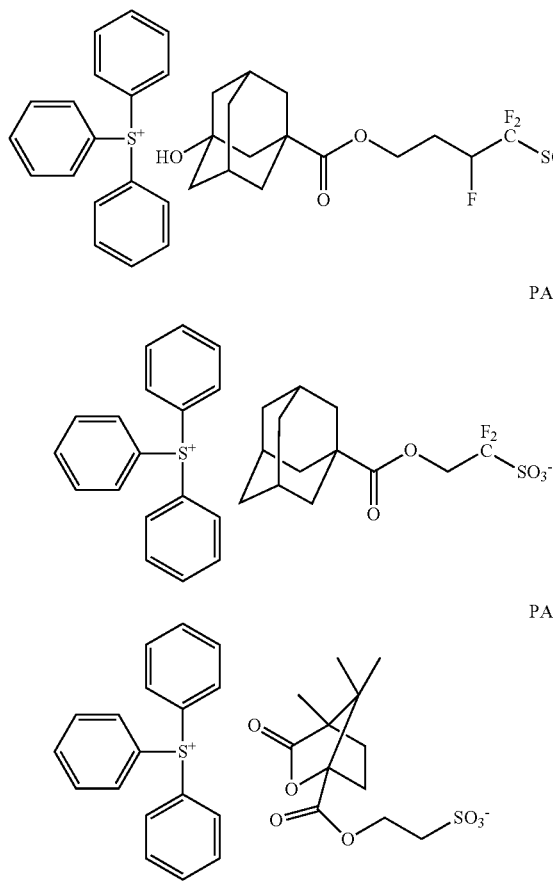

Component (F): Polymer Having the Following Structural Units

[Chemical Formula 36]

F-1

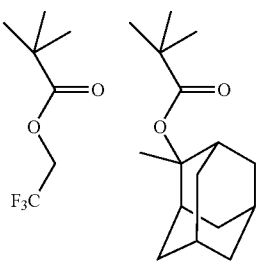

Component (S)
PGMEA: propylene glycol monomethyl ether acetate
PGME: propylene glycol monomethyl ether Formation of Negative-Tone Resist Pattern:
Examples 1 to 10 and Comparative
Examples 1 to 9

An organic anti-reflection film composition (product name: ARC95, manufactured by Brewer Science Ltd.) was applied to an 12-inch silicon wafer using a spinner, and the composition was then baked at 205° C. for 60 seconds and dried, thereby forming an organic anti-reflection film having a film thickness of 97 nm.

Then, the resist composition shown in Table 2 was applied to the film using a spinner, and was then subjected to post-applied bake (PAB) on a hotplate at a bake temperature of 110° C. for 60 seconds and dried, thereby forming a resist film having a film thickness of 85 nm.

Subsequently, the resist film was selectively irradiated with an ArF excimer laser (193 nm) through a photomask [att-PSM transparency: 6%, space width 63 nm/pitch 90 nm], using an immersion lithography ArF exposure apparatus S610 (manufactured by Nikon Corporation; NA (numerical aperture)=1.30, Crosspole).

Thereafter, post-exposure bake (PEB) treatment was conducted at 90° C. for 60 seconds.

Then, solvent development was conducted for 30 seconds using butyl acetate, followed by drying by shaking.

As a result, in each of the examples, a negative-tone pattern was formed.

<Evaluation of Negative-Tone Resist Pattern>
[Evaluation of Exposure Latitude Property]

In the present examples, a hole pattern (hereafter, referred to as "CH pattern") having a hole diameter of 45 nm and a pitch of 90 nm was formed. With respect to the exposure dose with which a CH pattern is formed, the exposure dose with which a CH pattern having a hole diameter within a target size ±5% was formed was determined, and the EL margin (unit: %) was determined by the following formula. In the following, Eop (mJ/cm$^2$) indicates the optimum exposure dose with which a CH pattern having a target size is formed in the formation of a resist pattern.

EL margin (%)=(|E1−E2|/Eop)×100

E1: Exposure dose (mJ/cm$^2$) with which a CH pattern having a hole diameter of 42.75 nm was formed
E2: Exposure dose (mJ/cm$^2$) with which a CH pattern having a hole diameter of 47.25 nm was formed The larger the value of the "EL margin", the smaller the change in the pattern size by the variation of the exposure dose.

[Evaluation of Maximum CD and Minimum CD]

With respect to the same CH pattern as in the exposure latitude property, evaluation was conducted with the following criteria.

Maximum CD: The maximum CD at which a hole can be formed when the exposure dose is decreased without being connected to an adjacent hole Minimum CD: The minimum CD at which holes are formed when the exposure dose is increased without filling of the holes.

The results are shown in Table 3.

TABLE 3

|  | EL | Maximum CD | Minimum CD |
|---|---|---|---|
| Example 1 | 8.3% | 61.2 | 32.3 |
| Example 2 | 7.7% | 59.8 | 30.2 |
| Example 3 | 8.6% | 62.1 | 31.9 |
| Example 4 | 8.6% | 63.1 | 32.2 |
| Example 5 | 8.1% | 60.9 | 29.8 |
| Comparative Example 1 | 7.3% | 58.9 | 32.8 |
| Comparative Example 2 | 7.4% | 58.4 | 35.5 |
| Comparative Example 3 | 6.4% | 56.5 | 32.5 |
| Comparative Example 4 | 6.9% | 57.2 | 34.2 |
| Comparative Example 5 | 6.8% | 57.3 | 35.2 |
| Comparative Example 6 | 5.4% | 56.4 | 36.3 |
| Comparative Example 7 | 5.9% | 56.9 | 35.9 |
| Example 6 | 9.4% | 60.8 | 31.3 |
| Example 7 | 8.6% | 60.5 | 32.1 |
| Example 8 | 7.8% | 62.3 | 31.3 |
| Example 9 | 8.0% | 63.2 | 30.1 |
| Example 10 | 8.2% | 59.5 | 32.1 |
| Comparative Example 8 | 7.4% | 58.5 | 34.2 |
| Comparative Example 9 | 7.0% | 59.2 | 34.5 |

As seen from the results shown in Table 3, in Examples 1 to 10, the EL values are larger as compared to Comparative Examples 1 to 9, meaning that the change in CD depending on the exposure dose is small and stable.

Further, in Examples 1 to 10, the difference between the maximum CD and the minimum CD is large as compared to Comparative Examples 1 to 9, meaning that the range where a pattern can be formed is large and the margin is large.

Further, it can be confirmed that, by using the resist composition of the present invention, a good pattern can be formed by both negative-tone development and positive-tone development, meaning that there is no problem in any kind of development.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist composition comprising:
a component (A) which exhibits changed solubility in a developing solution under action of acid, and
an acid-generator component (B) which generates acid upon exposure,
the component (A) comprising a polymeric compound having a structural unit represented by formula (1) shown below and a structural unit represented by general formula (2) shown below, wherein the acid-generator component (B) has an anion represented by formula (3) shown below:

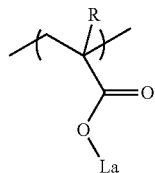

wherein in formula (1), R represents a hydrogen atom, an alkyl group or a halogenated alkyl group; La is selected from formula (1-1) or (1-2) shown below:

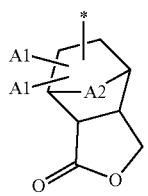

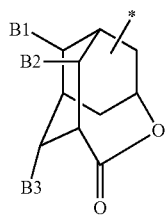

wherein "*" represents a valence bond; each A1 independently represents a hydrogen atom, an alkyl group, an alkoxy group, a halogenated alkyl group, a hydroxy group, —COOR', —OC(=O)R', a hydroxyalkyl group or a cyano group; A2 represents an oxygen atom (—O—), a sulfur atom (—S—) or an alkylene group containing an oxygen atom or a sulfur atom; B1, B2 and B3 each independently represents a hydrogen atom, an alkyl group, an alkoxy group, a halogenated alkyl group, a hydroxy group, —COOR', —OC(=O)R', a hydroxyalkyl group or a cyano group; R' represents a hydrogen atom or an alkyl group:

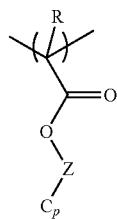

Wherein in formula (2), R represents a hydrogen atom, an alkyl group or a halogenated alkyl group; Z represents a single bond or an alkyl group; and $C_p$ is a group represented by general formula (Cp-1) shown below:

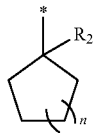 (Cp-1)

wherein $R_2$ represents a tertiary alkyl group, $n_p$ represents a positive integer, and * indicates the bonding position with Z;

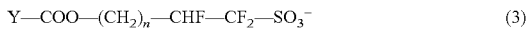 (3)

wherein Y represents a monocyclic or polycyclic group of 5 to 30 carbon atoms which may have a substituent, an alkyl group which may have a substituent, or an alkenyl group which may have a substituent; and n represents an integer of 1 to 5.

2. The resist composition according to claim 1, wherein $n_p$ is 1, and $R_2$ is a tert-butyl group.

3. The resist composition according to claim 1, wherein A1 is a hydrogen atom and A2 is a methylene group.

4. The resist composition according to claim 1, wherein each of B1, B2 and B3 is a hydrogen atom.

5. The resist composition according to claim 1, wherein Y is a polycyclic hydrocarbon group which may be substituted with a hydroxy group, or a polycyclic group which may have at least one carbon atom substituted with a carbonyl group.

6. The resist composition according to claim 1, wherein the component (A) is a base component which exhibits increased solubility in a developing solution by the action of acid.

7. A method of forming a resist pattern, comprising:
   forming a resist film using the resist composition of claim 1;
   exposing the resist film; and
   developing the resist film to form a resist pattern.

* * * * *